(12) United States Patent
Abdul-Gaffoor et al.

(10) Patent No.: US 8,971,826 B2
(45) Date of Patent: Mar. 3, 2015

(54) ANTENNA ELEMENT AS CAPACITIVE PROXIMITY/TOUCH SENSOR FOR ADAPTIVE ANTENNA PERFORMANCE IMPROVEMENT

(75) Inventors: Mohammed R. Abdul-Gaffoor, Palatine, IL (US); Brian Breunig, Algonquin, IL (US); Qiuming Li, Lincolnshire, IL (US); Akshat Mehrotra, Vernon Hills, IL (US)

(73) Assignee: Google Technology Holdings, LLC, Mountain View, CA (US)

( * ) Notice: Subject to any disclaimer, the term of this patent is extended or adjusted under 35 U.S.C. 154(b) by 451 days.

(21) Appl. No.: 13/401,933

(22) Filed: Feb. 22, 2012

(65) Prior Publication Data
US 2013/0217342 A1    Aug. 22, 2013

(51) Int. Cl.
H04B 1/40    (2006.01)
(52) U.S. Cl.
USPC ............................................. 455/77; 455/87
(58) Field of Classification Search
CPC ... H01Q 1/243; H03K 17/962; H03K 17/955; H04B 1/14; H04B 1/0458
USPC .............................................. 455/75, 77, 87
See application file for complete search history.

(56) References Cited

U.S. PATENT DOCUMENTS

| 6,657,595 | B1 | 12/2003 | Phillips et al. |
| 6,862,433 | B2 | 3/2005 | Callaway, Jr. |
| 2003/0210203 | A1 | 11/2003 | Phillips et al. |
| 2004/0155860 | A1 | 8/2004 | Wenstrand |
| 2006/0132360 | A1 | 6/2006 | Caimi et al. |
| 2007/0222697 | A1* | 9/2007 | Caimi et al. ............... 343/861 |
| 2007/0238496 | A1* | 10/2007 | Chung et al. ............ 455/575.7 |
| 2009/0295648 | A1 | 12/2009 | Dorsey et al. |
| 2011/0012793 | A1* | 1/2011 | Amm et al. ................ 343/702 |
| 2011/0076966 | A1 | 3/2011 | Ishimiya |

(Continued)

FOREIGN PATENT DOCUMENTS

| EP | 2276108 A1 | 1/2011 |
| EP | 2276109 A1 | 1/2011 |

OTHER PUBLICATIONS

Patent Cooperation Treaty, International Search Report and Written Opinion of the International Searching Authority for International Application No. PCT/US2013/026268, May 8, 2013, 10 pages.

(Continued)

Primary Examiner — Ping Hsieh
(74) Attorney, Agent, or Firm — Vincent L. Pham

(57) ABSTRACT

A method and communications device for providing antenna tuning to compensate for antenna de-tuning caused by a presence of an object detected using an antenna element within a capacitive touch and proximity sensor (CTPS). The CTPS propagates object detection signals associated with a detected object to a detection IC. An object detection and antenna tuning (ODAT) logic uses object detection signal information to generate tuning control signals to trigger compensatory antenna tuning, based on pre-established mappings of object detection signal data and antenna tuning states. The tuning control signals indicate at least one of (a) a level of compensatory antenna impedance tuning and (b) an amount of compensatory antenna length adjustment. In response to generating the tuning control signals, the ODAT logic triggers the propagation of the tuning control signals to the antenna matching and control circuit to provide the corresponding antenna tuning.

16 Claims, 13 Drawing Sheets

(56) References Cited

U.S. PATENT DOCUMENTS

| | | | |
|---|---|---|---|
| 2011/0105023 A1* | 5/2011 | Scheer et al. | 455/41.2 |
| 2011/0250928 A1* | 10/2011 | Schlub et al. | 455/550.1 |
| 2011/0281532 A1* | 11/2011 | Shin et al. | 455/77 |
| 2012/0329524 A1* | 12/2012 | Kent et al. | 455/566 |
| 2013/0045700 A1* | 2/2013 | Stallman et al. | 455/129 |
| 2013/0063323 A1* | 3/2013 | Mankaruse et al. | 343/861 |
| 2013/0069737 A1* | 3/2013 | See et al. | 333/32 |

OTHER PUBLICATIONS

Huttunen, Arttu et al.: "Capacitive Sensing of Antenna Loading With an R-C Voltage Divider in a Tunable Antenna", IEEE Sensors Journal, vol. 13, No. 2, Feb. 2013, all pages.

Huttunen, Arttu et al.: "Capacitive Sensing of Antenna Loading With an R-C Voltage Divider in a Tunable Antenna", IEEE Sensors Journal, vol. 13, No. 2, Feb. 2013, pp. 849-853.

* cited by examiner

| Object Detection: Sensor signal data | Operating condition | Antenna Tuning State for first operating frequency | Antenna Tuning State for second operating frequency | Antenna Tuning State for third operating frequency | Antenna Tuning State for remaining operating frequencies |
|---|---|---|---|---|---|
| Sensor signal data1 | Operating condition 1: (Free space: No object detected) | State 1 | State 2 | State 3 | State 7 |
| Sensor signal data2 | Operating condition 2: (first type detected object at first proximity) | State 4 | State 5 | State 6 | State 7 |
| Sensor signal data3 | Operating condition 3: (first type detected object at second proximity) | State 9 | State 10 | State 11 | State 7 |
| Sensor signal data4 | Operating condition 4: (second type detected object at first proximity) | State 12 | State 13 | State 14 | State 7 |
| Sensor signal data5 | Operating condition 5: (second type detected object at second proximity) | State 16 | State 17 | State 18 | State 7 |
| ........ | ........ | ........ | ........ | ........ | ........ |

802
804
806
808
810

ANTENNA ELEMENT AS CAPACITIVE PROXIMITY/TOUCH SENSOR FOR ADAPTIVE ANTENNA PERFORMANCE IMPROVEMENT

BACKGROUND

1. Technical Field

The present disclosure relates in general to communication devices and in particular to object detection and antenna tuning in communication devices.

2. Description of the Related Art

In many wireless communication devices, traditional approaches to object detection are implemented. For example, Transmit Power Reduction is a commonly applied technique that is used to mitigate Near Field Electromagnetic Energy Exposure when an object comes into close proximity to a transmit antenna in the wireless communication device. The level of Transmit Power Reduction is based upon determining whether object contact or proximity occurs close to the antenna elements of the wireless communication device. One of the approaches for object detection is to employ a "separate" capacitive proximity sensor "near" the antenna element to detect presence of a body/object and then to reduce transmit power.

One of the mechanisms by which the antenna performance degrades is the detuning of a narrow bandwidth antenna when the antenna of a cell-phone is touched by a person's hand. In one implementation, the capacitive proximity sensor is required to detect the presence of human body presence within a range of up to 8 to 10 mm from the sensor. This specific range is required to enable the device to meet near field electromagnetic energy exposure requirements. The physical area required to implement this particular sensor is about 500 mm squared. Even within larger sized wireless communications and/or processing devices, it is becoming difficult to find space for a separate capacitive proximity sensor for multiple antennas (e.g., the various antennas employed for 2G/3G/4G). In fact, one of the reasons antennas in a wireless communication have narrow bandwidth is due to lack of sufficient volume (area) for the antenna element. One approach to the spatial/real-estate challenge is a non-optimal SAR control solution based on orientation. This approach is commonly applied in larger devices like "tablets". Nevertheless, the difficult challenge of finding room in wireless communications device for a separate capacitive proximity sensor to detect the presence of an object persists.

BRIEF DESCRIPTION OF THE DRAWINGS

The described embodiments are to be read in conjunction with the accompanying drawings, wherein:

FIG. 8 is a table that illustrates associations of object detection signal information with operating conditions and antenna tuning states, according to one embodiment;

DETAILED DESCRIPTION

Figure 1:
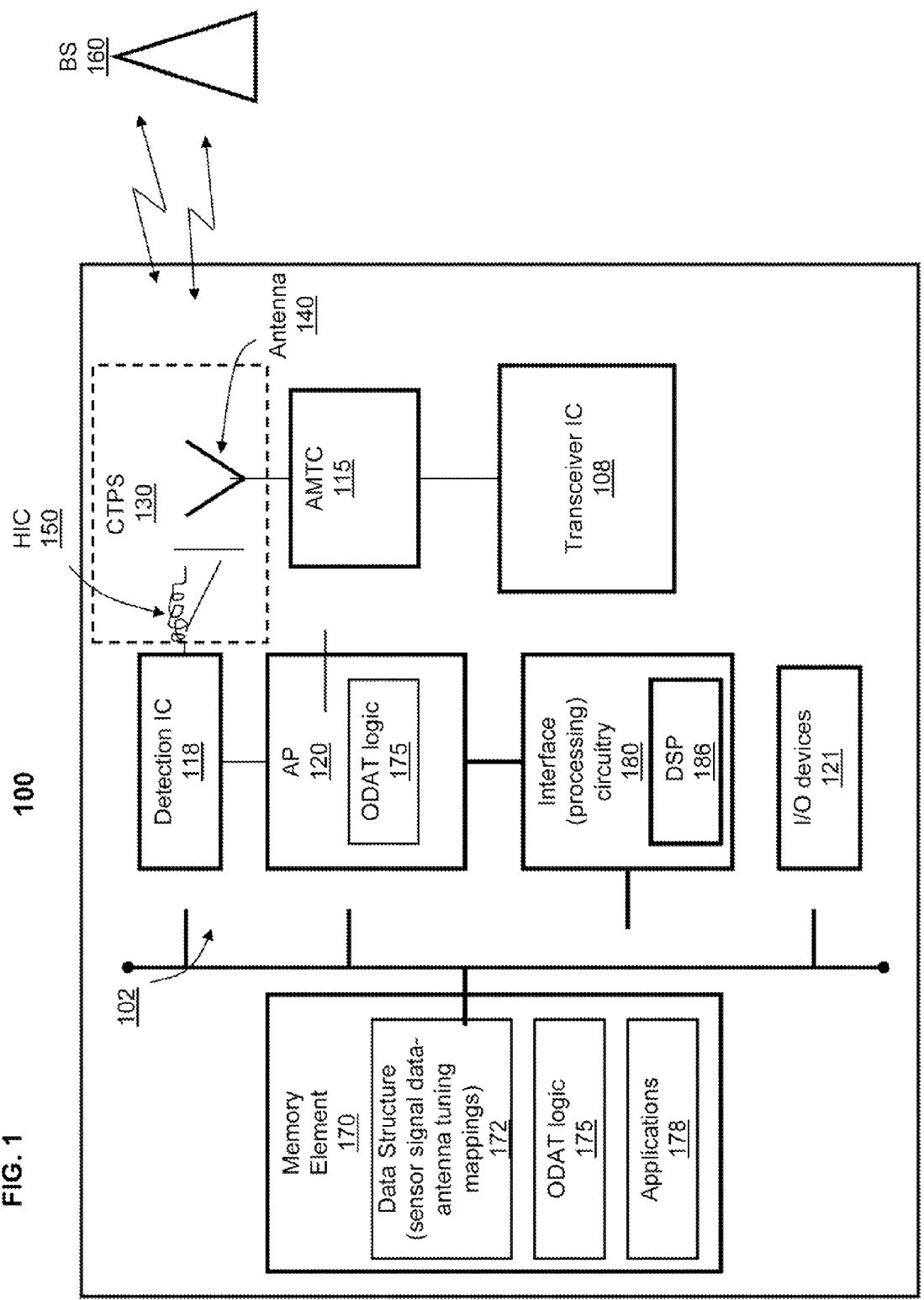
FIG. 1 illustrates an example block diagram representation of a wireless communications device, within which features of the described embodiments can be incorporated, according to one embodiment.

The illustrative embodiments provide a method and communication device that implements a capacitive proximity sensor which does not take up extra space and/or minimizes the additional space used within the communication device and which can help mitigate detuning of the device's antenna due to proximity of objects, in addition to helping with transmit power reduction. According to one or more embodiments, the communication device provides antenna tuning to compensate for antenna de-tuning caused by a presence of an object that is detected by a capacitive touch and proximity sensor (CTPS) which includes an antenna element. The CTPS propagates object detection signals associated with a detected object to a detection IC. In response to receipt of the object detection signals, the detection IC sends detection signal information to an application processor (AP). Object detection and antenna tuning (ODAT) logic within the AP processes object detection signal information to generate tuning control signals to trigger compensatory antenna tuning, based on pre-established associations of object detection signal data and antenna tuning states. The tuning control signals indicate at least one of (a) a level of compensatory antenna impedance tuning and (b) an amount of compensatory antenna length adjustment. In response to generating the tuning control signals, the ODAT logic triggers the propagation of the tuning control signals to the antenna matching and control circuit to provide the corresponding antenna tuning.

In the following detailed description of exemplary embodiments of the disclosure, specific exemplary embodiments in which the disclosure may be practiced are described in sufficient detail to enable those skilled in the art to practice the disclosure, and it is to be understood that other embodiments may be utilized and that logical, architectural, programmatic, mechanical, electrical and other changes may be made without departing from the spirit or scope of the present disclosure. The following detailed description is, therefore, not to be taken in a limiting sense, and the scope of the present disclosure is defined by the appended claims and equivalents thereof.

Within the descriptions of the different views of the figures, similar elements are provided similar names and reference numerals as those of the previous figure(s). The specific numerals assigned to the elements are provided solely to aid in the description and are not meant to imply any limitations (structural or functional or otherwise) on the described embodiment.

It is understood that the use of specific component, device and/or parameter names, such as those of the executing utility, logic, or firmware described herein, are for example only and not meant to imply any limitations on the described embodiments. The embodiments may thus be described with different nomenclature or terminology or acronyms utilized to describe the components, devices and parameters herein, without limitation. References to any specific protocol or proprietary name in describing one or more elements, features or concepts of the embodiments are provided solely as examples of one implementation, and such references do not limit the extension of the claimed embodiments to embodiments in which different element, feature or concept names are utilized. Thus, each term utilized herein is to be given its broadest interpretation given the context in which that term is utilized.

As further described below, implementation of the functional features of the disclosure described herein is provided within processing devices/structures and can involve use of a combination of hardware, firmware, as well as several software-level constructs (e.g., program code) that are executed by a processing device to provide a specific utility for the device. The presented figures illustrate both hardware components and software/logic components within example communication device architecture.

With specific reference now to FIG. 1, there is depicted a block diagram of an example wireless communications device 100, within which certain of the functional aspects of the described embodiments may advantageously be implemented. For simplicity, wireless communications device 100 shall be referred to herein simply by the acronym WCD 100. In one embodiment, the wireless communications device is a mobile device, such as a cellular phone, smartphone or laptop, netbook or tablet computer or similar device. As such, WCD 100 can be any type of communication device with a transceiver that includes a two-way radio communications device. WCD 100 comprises applications processor 120 and communication interface circuitry 180 which comprises digital signal processor (DSP) 186. Applications processor 120 is connected to memory element 170 via signal bus 102. WCD 100 includes a radio frequency (RF) transceiver integrated circuit (IC) 108 that enables WCD 100 to send and receive communication signals.

In at least one embodiment, the sending and receiving functions of the transceiver occurs wirelessly, and the wireless communication is facilitated by one or more antennas, for example, antenna 140, which work in conjunction with the transceiver IC 108. The number of antennas can vary from device to device, ranging from a single antenna to two or more antennas, and the presentation within WCD 100 of one antenna is merely for illustration. Furthermore, each antenna 140 can have multiple antenna arms, as illustrated in the later described configuration of FIG. 7. WCD 100 is able to wirelessly communicate with, for example, base-station (BS) 160 via antenna 140. WCD 100 also comprises detection integrated circuit (IC) 118 and antenna matching and tuning circuit (AMTC) 115, which provide specific functionality that is described in greater detail below. WCD 100 also includes at least one high impedance component (HIC) 150 coupled between at least one antenna 140 and detection IC 118. In one embodiment, the combination of antenna(s) 140 and HIC 150 provides capacitive touch and proximity sensor (CTPS) 130. In the embodiments described hereinafter, application processor (AP) 120 receives, from detection IC 118, object detection signal information and generates antenna tuning control signals to provide compensation for the presence of an object detected by CTPS 130. Also included in WCD 100 is I/O device(s) 121.

In addition to the above described hardware components of WCD 100, various features of the described embodiments can be completed and/or supported via software or firmware code or programmable logic stored within memory 170, or other storage devices (not shown) and executed by one of AP 120 and DSP 186. Thus, for example, illustrated within memory 170 are a number of software, firmware, and/or logic components or modules, including a data structure 172, which can be a table of object detection signal data and antenna tuning mappings, and applications 178. As illustrated, memory 170 can also comprise object detection and antenna tuning (ODAT) logic/utility 175. In one implementation, ODAT logic 175 is included within AP 120.

In the descriptions which follow, ODAT logic 175 represents additional software, firmware, and/or logic components, which execute on AP 120 to provide specific functions, as described below. In the described embodiment, ODAT logic 175 provides certain executable code that triggers AP 120 to perform certain antenna tuning related functions. Additional detail of the functionality associated with ODAT logic 175 is presented below with reference to FIG. 2 and subsequent figures.

Certain of the functions supported and/or provided by ODAT logic 175 can be implemented via processing logic or code executed by a wireless device processor and/or other device hardware. Among the software code, which can be interchangeably referred to herein as program instructions and programmable logic, that can be provided by ODAT logic 175, in the described embodiments, are: (a) logic for receiving, from a detection IC, object detection signal information associated with the presence of an object that is detected using a capacitive touch and proximity sensor that (i) utilizes an antenna element as a sensor probe and (ii) propagates object detection signals to the detection IC; (b) logic for retrieving a data structure of pre-established associations and mappings of object detection signal data and antenna tuning states; (c) logic for identifying a match between object detection signal information associated with a currently detected object and pre-established object detection signal data; (d) logic for determining a required type and level of antenna tuning based on identifying the matching pre-established object detection signal data; and (e) logic for generating control signals to trigger the required antenna tuning at an antenna matching and tuning circuit (AMTC) component 115.

According to the described embodiments, the term "antenna tuning" is used to refer to at least one of the following: (a) impedance matching antenna tuning that may provide impedance matching to an antenna resonator structure for desired operating frequencies; and (b) electrical length antenna tuning that may directly adjust the resonator structure of the antenna. This adjustment of the resonant structure of the antenna can be accomplished if the antenna tuner (e.g., AMTC 115) comprises one or more micro-electric machine (MEM) switches. In one embodiment, MEMs are integrated into the antenna structure and modify the lengths of the antenna resonator when the MEMs are actuated, or by other methods known in the art. Impedance matching antenna tuning provides antenna tuning using a matching network. Antenna impedance matching is more specifically provided by conjugate impedance matching. AMTC 115 is able to expand a bandwidth of the radiating element by (a) shifting or tuning the actual resonant frequency or (b) adjusting the electrical length of the radiating element directly. In one embodiment, AMTC 115 comprises several components that include at least one of: (a) series or shunt inductors; (b) series or shunt capacitors; and (c) RF switches to selectively switch inductors and capacitors into or out of a circuit to provide the required antenna tuning. These components enable AMTC 115 to provide the necessary antenna tuning functionality associated with a radiating element.

Figure 2:
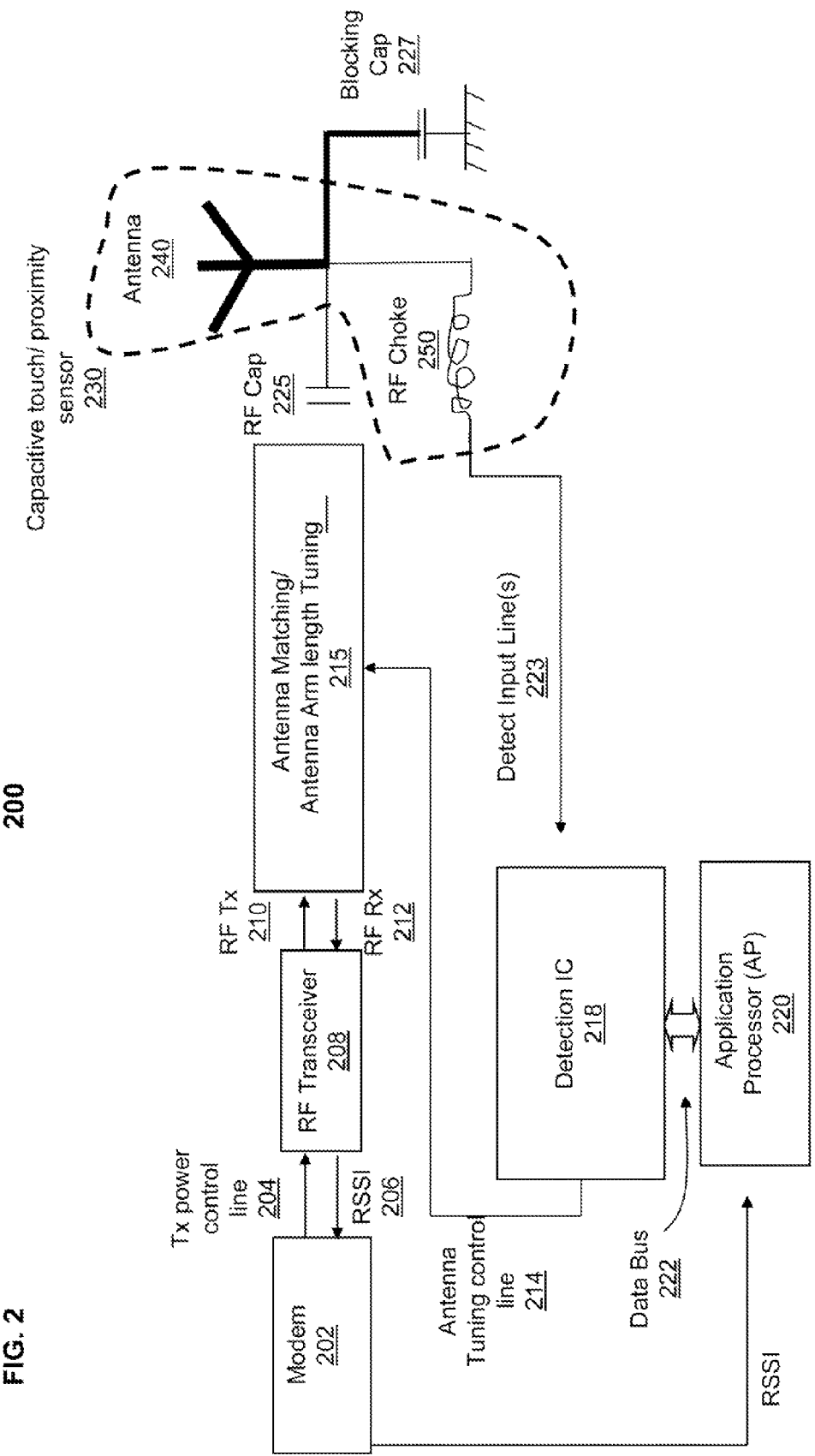
FIG. 2 illustrates a block diagram representation of radio frequency communications components (RFCCs), including a capacitive touch and proximity sensor (CTPS), in a wireless communication device (WCD), according to one embodiment.

With reference now to FIG. 2, there is presented a block diagram representation of radio frequency communications components (RFCC) 200, including CTPS 230, according to one embodiment. RFCC 200 illustrates a first configuration among several configurations presented herein and illustrated by FIGS. 2-7. These various configurations provide WCD 100 with the ability to detect object contact with antenna element 240 and/or object proximity relative to antenna element 240 of, for example a WCD 100. In addition, each RFCC 200 . . . 700 is able to process object detection signals associated with detected objects in order to provide compensatory antenna tuning, but each RFCC 200 . . . 700 can accomplish these tasks using a different connectivity and communication paths among the set of interconnected components. Thus, as provided, each RFCC has a different configuration of and/or connectivity among the different components, and as such, each RFCC provides a different approach to (a) processing the received object detection signals and/or (b) to providing the appropriate compensation for antenna de-tuning and/or signal power reduction caused by the object's presence. As an underlying theme throughout the different configurations, the AP 220 . . . 720 within each RFCC 200 . . . 700 performs some or all of the processing of the received object detection signal information, and the AMTC 215 . . . 715 is ultimately triggered to perform the required adjustments and/or tuning to the antenna. Because the same core components can have differences in operation from one configuration to the other, each figure and the components of that figure is provided with a leading reference numeral corresponding to the particular figure.

Referring specifically to FIG. 2, RFCC 200 comprises AMTC 215 coupled to an output of RF transceiver 208. RFCC 200 also comprises antenna element 240 coupled to an output of antenna matching and tuning circuit 215 by coupling capacitor 225. Antenna element 240 is RF shorted to ground using a low frequency blocking capacitor 227. In one embodiment, the blocking capacitor 227 is needed for the proper functioning of CTPS 230 when the antenna element requires grounding at RF frequencies. Antenna element 240 is further coupled to at least one RF choke 250 which is described hereinafter as the specific example of HIC 150 of FIG. 1. Antenna element 240 and RF choke 250 collectively function to provide a capacitive touch and proximity sensor (CTPS) 230. CTPS 230 provides a sensor probe (which in the various embodiments is the antenna element 240) that can be used for detecting physical contact by an object and/or proximity of an object. Also included within RFCC 200 is detection IC 218 that is coupled to RF choke 250 of CTPS 230. RFCC 200 also includes modem 202 that is coupled to RF transceiver 208. RF transceiver 208 forwards/provides, to modem 202, a received signal strength indicator (RSSI) that provides information about RF signal power detected at antenna element 240. Additionally, RFCC 200 comprises application processor (AP) 220 that is connected by data bus 222 to detection IC 218. In addition, AP 220 is coupled to an output signal port of modem 202. As further illustrated by this embodiment, AMTC 215 is coupled to detection IC 218 by antenna tuning control line 214.

Detection IC 218 operates in conjunction with CTPS 230 to detect both physical contact by an object with antenna element 240 and a presence of an object within a specific proximity of antenna element 240 while antenna element 240 is being used to transmit and receive RF signals. This specific proximity refers to a space or area near antenna 240 in which a presence of an object (a) is detectable by detection IC 118 (i.e., within a detectable range) and/or (b) can affect the electric field associated with at least one antenna element and/or at least one antenna arm. By affecting the electrical field, the proximate object can consequently change the capacitance of at least one antenna element and/or at least one antenna arm.

Detection IC 218 sends a low frequency charging/discharging signal to the antenna element and/or corresponding antenna arm. Detection IC 218 uses the low frequency charging/discharging signal to allow detection IC 218 to sense a change in capacitance of CTPS 230 when a human body, a hand or some other conductive object comes within a specific proximity of the antenna element. For example, if detection IC 218 sends a low frequency charging signal to an antenna element and/or antenna arm, any changes in the capacitance of the antenna element and/or arm due to an object's presence are reflected within the return, discharging signal. In this instance, this return discharging signal is the object detection signal. Detection IC 218 is able to receive object detection signals having different characteristics that can be used to uniquely characterize an object that is being detected and a de-tuning impact the object's presence has upon the electrical properties of a corresponding object detection signal. The electrical properties (of an object detection signal) that can be impacted by the presence of an object can include signal strength and/or an amplitude of the object detection signal. In response to at least one of a physical contact by the object with antenna element 240 and a presence of an object within specific proximity (e.g., within the detectable range) of antenna element 240, CTPS 230 propagates a return signal with measurable electrical characteristics that correspond to a change in capacitance associated with at least one of the antenna element and an antenna arm of the antenna element. The change(s) in capacitance associated with the antenna element causes changes in the electrical properties of an object detection signal that propagates through RF choke 250 to a corresponding input port of detection IC 218.

In one embodiment, CTPS 230 provides dynamically varying levels of current flow to detection IC 218. The amount of current flow is determined by changes in capacitance, and the capacitance changes are caused by changes in the distance between an antenna element or an arm of the antenna element and the target object. The sensor electronics are calibrated to generate specific voltage changes for corresponding changes in capacitance. These voltages are scaled to represent specific changes in distance of the object to the antenna element. The amount of voltage change for a given amount of distance change is referred to as the sensitivity of CTPS 230.

When a voltage is applied to the antenna element, an electric field emanates from a sensing area of the antenna element. An object changes the electric field. CTPS 230 detects changes in the electric field caused by the object's presence. In one embodiment, the object presence is measured simultaneously by multiple probes (e.g., multiple arms of an antenna element, as described in FIG. 7). Because the system measures a changing electric field, the excitation voltage for each probe is synchronized to prevent the probes from interfering with each other.

In response to receipt of at least one object detection signal, detection IC 218 triggers a transmission of at least one control signal to AMTC 215 to provide a specific type and level of antenna tuning to offset antenna de-tuning caused by an object's presence (i.e., at least one of the proximity of the object to and the contact by the object with the antenna element). In particular, detection IC 218, in response to receiving the object detection signal(s) from the CTPS 230, provides corresponding object detection signal information to AP 220. In one embodiment, in addition to providing, to AP 220, information about electrical properties of a corresponding object detection signal, detection IC 218 provides, within the object detection information, additional information that maps an object detection signal to a corresponding antenna arm of the antenna element. In addition to receipt of object detection signal information from detection IC 218, AP 220 receives RF signal power information from modem 202 corresponding to a RF signal power at antenna element 240. Based on the received object detection signal information and power signal information, AP 220 generates antenna tuning control signals to trigger a corresponding antenna tuning. The antenna tuning control signals generated by AP 220 indicate at least one of (a) a level of compensatory antenna impedance tuning and (b) an amount of compensatory antenna length adjustment. After generating the antenna tuning control signals, AP 220 forwards the antenna tuning control signals to detection IC 218. Detection IC 218 propagates the antenna tuning control signals to AMTC 215, via antenna tuning control line 214, to provide the corresponding antenna tuning.

In one embodiment, responsive to receipt of the object detection information, AP 220 retrieves a stored data structure 172 that comprises associations of operating condition and pre-established object detection signal data to identify a current operating condition corresponding to the object detection signal provided by CTPS 230. AP 220 identifies, from the pre-established object detection signal data, (a) a first object detection signal data that matches the received object detection signal information and (b) an operating condition that is associated with the first object detection signal data. When the first object detection signal data matches the received object detection signal information, AP 220 determines that the operating condition that is associated with the first object detection signal data represents a current operating condition of WCD 100. AP 220 determines an appropriate antenna tuning adjustment required to effectively compensate for an antenna de-tuning that is associated with the identified current operating condition. AP 220 determines the antenna tuning adjustment based on at least one of: (a) the current operating condition; (b) a current operating frequency band utilized by the wireless communications device; and (c) preset associations of operating conditions and antenna tuning states.

Figure 3:
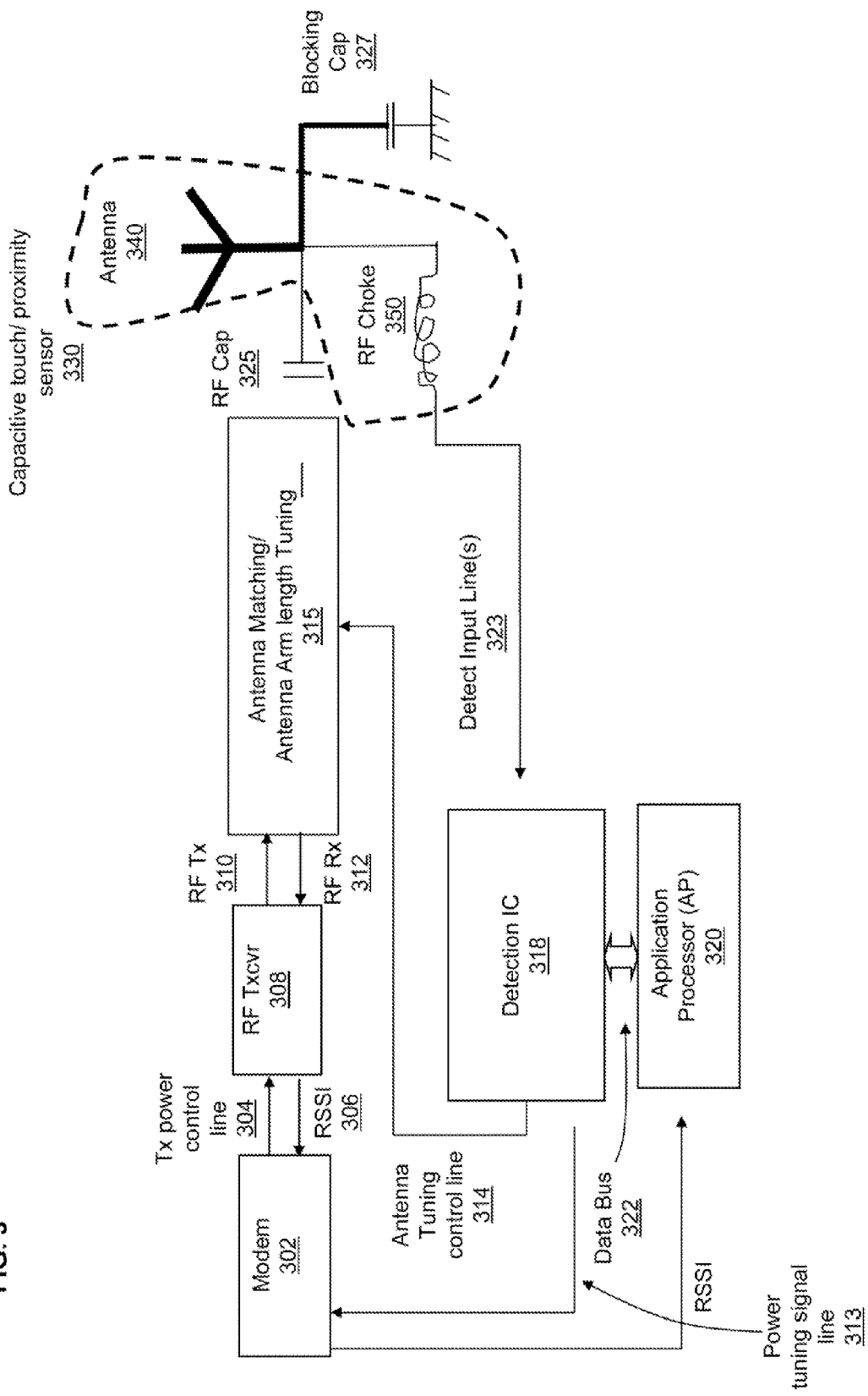
FIG. 3 illustrates a block diagram representation of RFCCs, including a CTPS, in a WCD, according to a second embodiment.

FIG. 3 illustrates a block diagram representation of RFCCs, including a CTPS, in a WCD, according to a second embodiment. RFCC 300 illustrates a second configuration from among several configurations that are presented herein. RFCC 300 comprises AMTC 315 coupled to an output of RF transceiver 308. RFCC 300 also comprises antenna element 340 coupled to an output of AMTC 315 by coupling capacitor 325. Antenna element 340 is RF shorted to ground using a low frequency blocking capacitor 327. Antenna element 340 is further coupled to at least one RF choke 350. Antenna element 340 and RF choke 350 collectively function to provide CTPS 330. Also included within RFCC 300 is detection IC 318 that is coupled to RF choke 350 of CTPS 330. RFCC 300 also includes modem 302 that is coupled to RF transceiver 308. RF transceiver 308 forwards/provides, to modem 302, a RSSI that provides information about RF signal power detected at antenna element 340. Additionally, RFCC 300 comprises AP 320 that is connected by data bus 322 to detection IC 318. According to this embodiment, detection IC 318 is connected to an input port of modem 302 by power tuning signal line 313. In addition, AP 320 is coupled to an output signal port of modem 302. As further illustrated, in this embodiment, AMTC 315 is coupled to detection IC 318.

RFCC 300 provides several functional additions to RFCC 200. In particular, modem 302 is coupled to an output port of detection IC 318. Furthermore, AP 320 generates additional tuning parameters that comprise power control information that is utilized to provide a signal power adjustment at RF transceiver 308. With RFCC 300, in response to receiving an object detection signal(s) from CTPS 330, detection IC 318 provides corresponding object detection signal information to AP 320. In addition to receipt of object detection signal information from detection IC 318, AP 320 receives RF signal power information from modem 302 corresponding to a RF signal power at antenna element 340. Based on the received object detection signal information and RF signal power information, AP 320 generates antenna tuning control signals to trigger a corresponding antenna tuning. In addition, AP 320 generates power control information that is utilized to provide a signal power adjustment at RF transceiver 308. The signal power adjustment enables WCD 100 to satisfy transmitting power requirements and is determined by utilizing the received RF signal power information and the object detection signal information. The antenna tuning control signals generated by AP 320 indicate at least one of (a) a level of compensatory antenna impedance tuning and (b) an amount of compensatory antenna length adjustment. After generating the antenna tuning control signals and the power control information, AP 320 forwards the antenna tuning control signals and the power control information to detection IC 318. Detection IC 318 propagates the antenna tuning control signals to AMTC 315 to provide the corresponding antenna tuning. Also, detection IC 318 propagates the power control information and/or parameters to modem 302 via power tuning signal line 313. In response to receiving the power control information, modem 302 generates a power control signal and forwards the power control signal to RF transceiver 308 to provide a corresponding signal power adjustment at RF transceiver 308.

Figure 4:
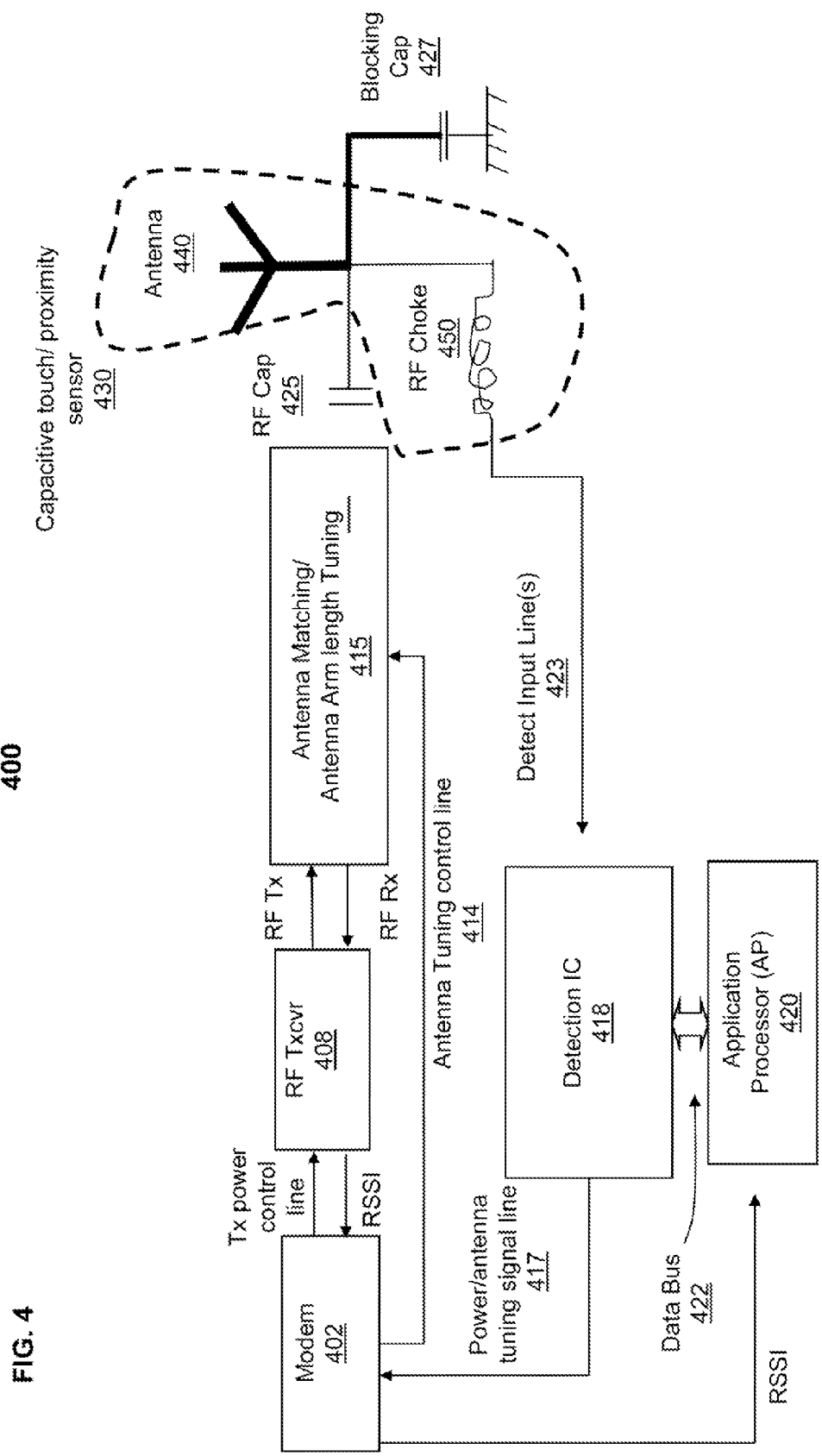
FIG. 4 illustrates a block diagram representation of RFCCs, including a CTPS, in a WCD, according to a third embodiment.

FIG. 4 illustrates a block diagram representation of radio frequency communications components (RFCC), including a capacitive touch and proximity sensor, in a wireless communications device (WCD), according to a third embodiment. RFCC 400 illustrates a third configuration from among the several configurations that are presented herein. RFCC 400 comprises AMTC 415 coupled to an output of RF transceiver 408. RFCC 400 also comprises antenna element 440 coupled to an output of AMTC 415 by coupling capacitor 425. Antenna element 440 is RF shorted to ground using a low frequency blocking capacitor 427. Antenna element 440 is further coupled to at least one RF choke 450. Antenna element 340 and RF choke 350 collectively function to provide CTPS 330. Also included within RFCC 400 is detection IC 418 that is coupled to RF choke 450 of CTPS 430. RFCC 400 also includes modem 402 that is coupled to RF transceiver 408. RF transceiver 408 forwards/provides, to modem 402, a RSSI that provides information about RF signal power detected at antenna element 440. Additionally, RFCC 400 comprises AP 420 that is connected by data bus 422 to detection IC 418. In addition, AP 420 is coupled to an output signal port of modem 402. In addition, modem 402 is coupled to an output port of detection IC 418. RFCC 400 provides several functional modifications and additions to RFCC 300. In particular, unlike the configuration of RFCC 300, detection IC 418 is not directly coupled to AMTC 415 to provide tuning control signals. According to this embodiment, detection IC 418 is connected by power/antenna tuning signal line 417 to modem 402, and detection IC 418 to provides both power tuning parameters and antenna tuning parameters to modem 402 via power/antenna tuning signal line 417. Modem 402 is also connected via antenna tuning control line 414 to AMTC 415 to enable modem 402 to provide an antenna tuning control signal directly to AMTC 415 to trigger the corresponding antenna tuning.

In RFCC 400, AP 420 receives object detection signal information from detection IC 418. In addition to receipt of object detection signal information from detection IC 418, AP 420 receives RF signal power information, RSSI, from modem 402 corresponding to a RF signal power at antenna element 440. Based on the received object detection signal information and RF power signal information, AP 420 generates tuning parameters that comprise RF power control information and antenna tuning control signals. AP 420 sends the tuning parameters to detection IC 418 which forwards the tuning parameters, via power/antenna tuning signal line 417, to modem 402 to cause modem 402 to (a) generate a power control signal; (b) propagate the power control signal to RF transceiver 408 to provide a corresponding signal power adjustment at RF transceiver 408; and (c) propagate the antenna tuning control signal, via antenna tuning control line 414, to AMTC 415 to provide the compensatory antenna tuning.

Figure 5:
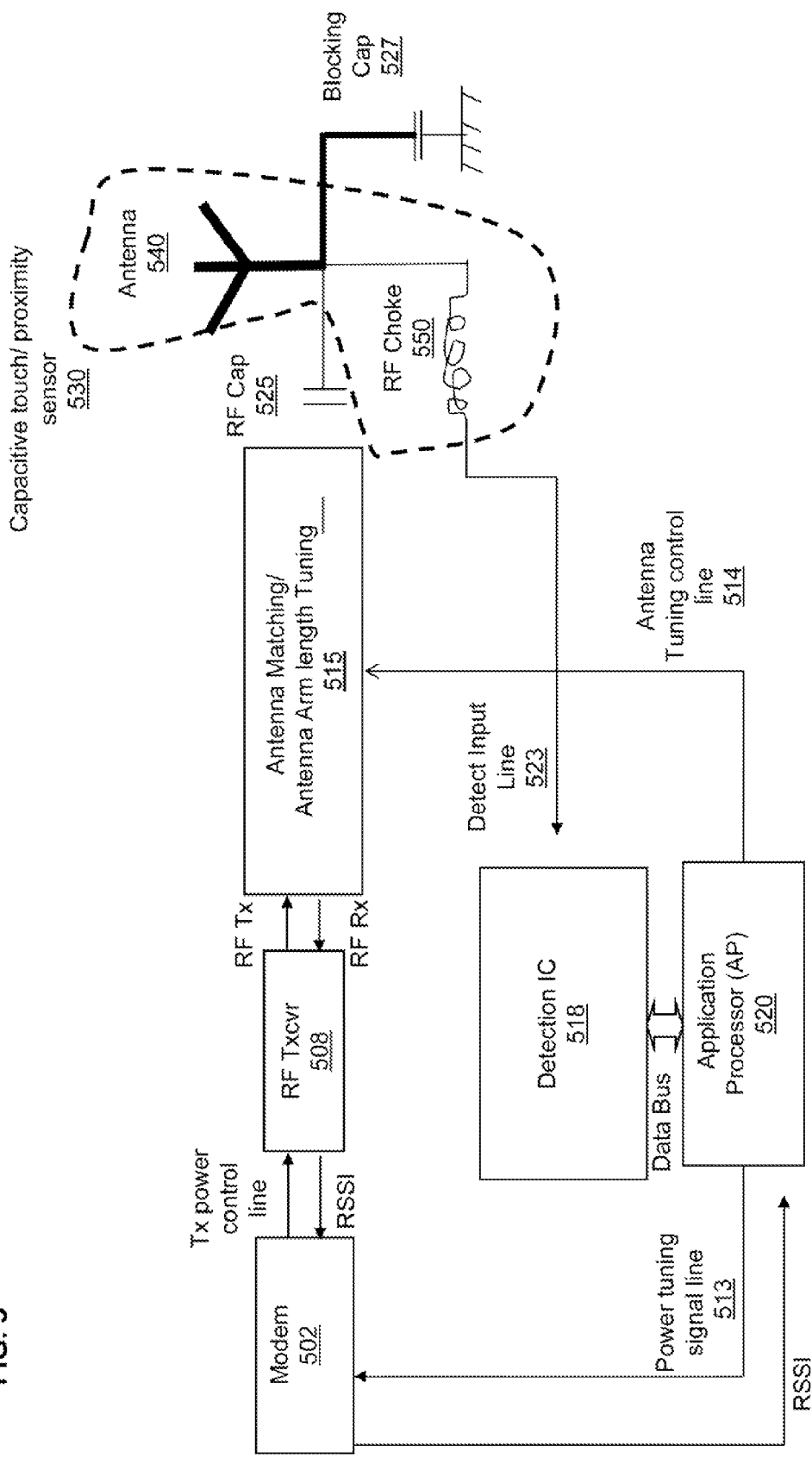
FIG. 5 illustrates a block diagram representation of RFCCs, including a CTPS, in a WCD, according to a fourth embodiment.

FIG. 5 illustrates a block diagram representation of RFCCs, including a CTPS, in a WCD, according to a fourth embodiment. RFCC 500 comprises AMTC 515 coupled to an output of RF transceiver 508. RFCC 500 also comprises antenna element 540 coupled to an output of AMTC 515 by coupling capacitor 525. Antenna element 540 is RF shorted to ground using a low frequency blocking capacitor 527. Antenna element 540 is further coupled to at least one RF choke 550. Antenna element 340 and RF choke 350 collectively function to provide CTPS 330. Also included within RFCC 500 is detection IC 518 that is coupled to RF choke 550 of CTPS 530. RFCC 500 also includes modem 502 that is coupled to RF transceiver 508. RF transceiver 508 forwards/provides, to modem 502, a RSSI that provides information about RF signal power detected at antenna element 540. Additionally, RFCC 500 comprises AP 520 that is connected by data bus 522 to detection IC 518. In addition, AP 520 is coupled to an output signal port of modem 502. RFCC 500 provides several modifications and/or functional additions to RFCC 300. In particular, in RFCC 500, unlike the configuration of RFCC 300, detection IC 518 is not coupled to AMTC 515 to provide tuning control signals, and modem 502 is not coupled to an output port of detection IC 518. However, modem 502 is coupled to an output port of AP 520 via power tuning signal line 513. Furthermore, AP 520 is directly coupled to AMTC 515 via antenna tuning control line 514, which propagates an antenna tuning control signal to AMTC 515 to provide the appropriate antenna tuning.

In RFCC 500, AP 520 generates a tuning control signal and a power control signal, using RF signal power information received from modem 502 and the object detection signal information received from detection IC 518. AP 520 forwards (a) the antenna tuning control signal to AMTC 515 to provide a corresponding antenna tuning, and (b) the power control signal to modem 502 to trigger a transmit signal power adjustment at RF transceiver 508.

Figure 6:
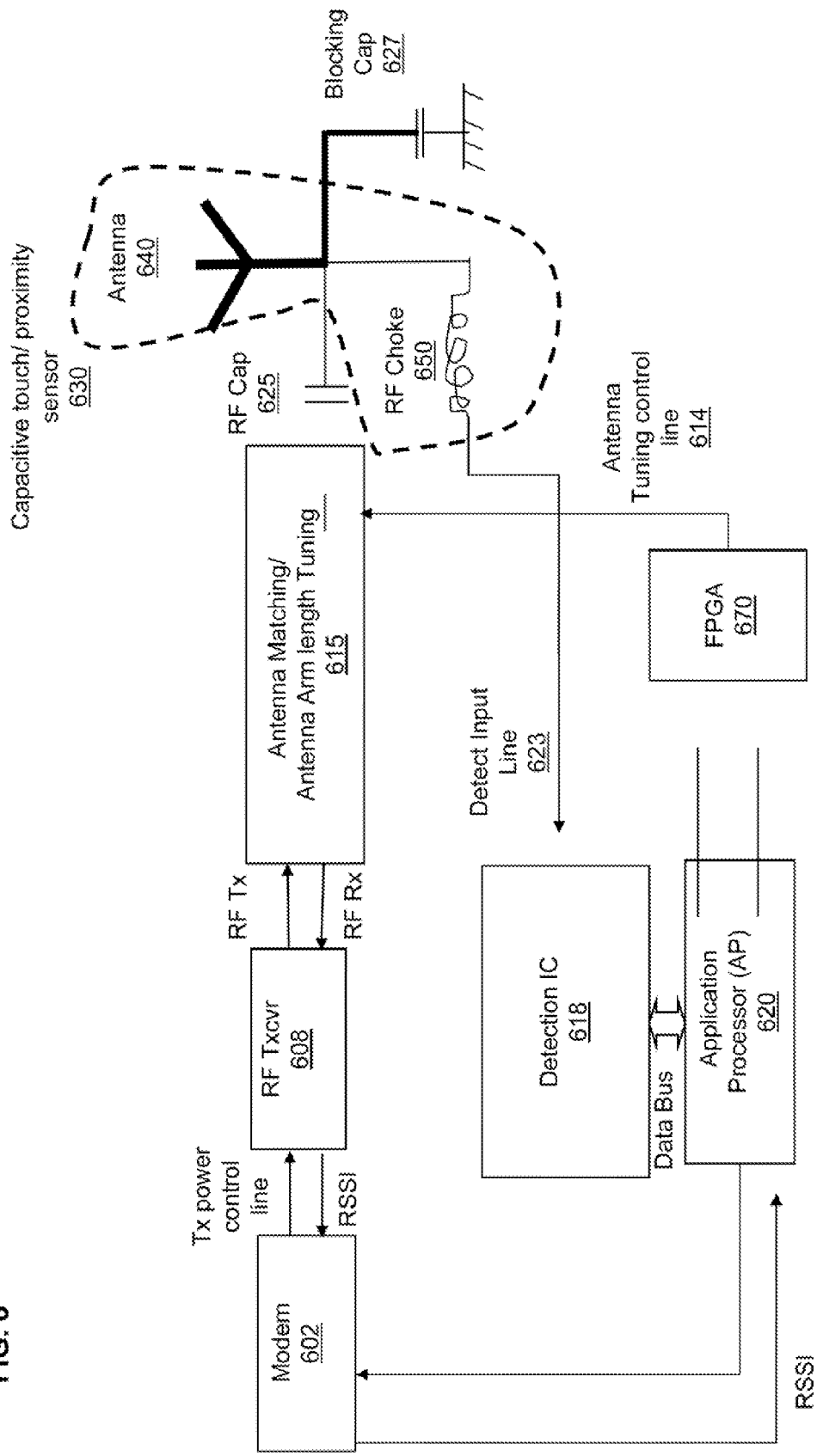
FIG. 6 illustrates a block diagram representation of RFCCs, including a CTPS, in a wireless communications device (WCD), according to a fifth embodiment.

FIG. 6 illustrates a block diagram representation of RFCCs, including a CTPS, in a WCD, according to a fifth embodiment. Similar to RFCC 500, RFCC 600 comprises AMTC 615 coupled to an output of RF transceiver 608. RFCC 600 also comprises antenna element 640 coupled to an output of AMTC 615 by coupling capacitor 625. Antenna element 640 is RF shorted to ground using a low frequency blocking capacitor 627. Antenna element 640 is further coupled to at least one RF choke 650. Antenna element 640 and RF choke 650 collectively function to provide CTPS 630. Also included within RFCC 600 is detection IC 618 that is coupled to RF choke 650 of CTPS 630. RFCC 600 also includes modem 602 that is coupled to RF transceiver 608. RF transceiver 608 forwards/provides, to modem 602, a RSSI that provides information about RF signal power detected at antenna element 640. Additionally, RFCC 600 comprises AP 620 that is connected by data bus 622 to detection IC 618. In addition, AP 620 is coupled to an output signal port of modem 602. RFCC 600 provides several functional additions to RFCC 500. In particular, RFCC 600 specifically illustrates the addition and use of Field Programmable Gate Array (FPGA) component 670. In RFCC 600, AP 620 is not directly connected to AMTC 615. FPGA component 670 is coupled directly to AMTC 615 via antenna tuning control line 614 and, in particular, FPGA component 670 is coupled between two control output ports of AP 620 and a control signal input of AMTC 615.

In RFCC 600, AP 620 generates a transmit power control signal and multiple antenna tuning control signals. AP 620 forwards the transmit power control signal to modem 602 to trigger a transmit signal power adjustment at RF transceiver 608. In addition, AP 620 forwards the multiple tuning control signals to FPGA component 670 to cause FPGA component 670 to selectively provide AMTC 620, via antenna tuning control line 614, with at least one of (a) a first control signal for antenna tuning in response to switching an operating frequency band of the AE and (b) a second control signal for antenna tuning based on a CTPS object detection signal. In one embodiment, AP 620 provides object detection signal information and information about operating frequency changes to cause FPGA 670 to generate the appropriate tuning control signals. FPGA component 670 is able to selectively provide AMTC 620 with at least one of (a) a first control signal for antenna tuning in response to switching an operating frequency band of the AE and (b) a second control signal for antenna tuning based on a CTPS object detection signal.

Figure 7:
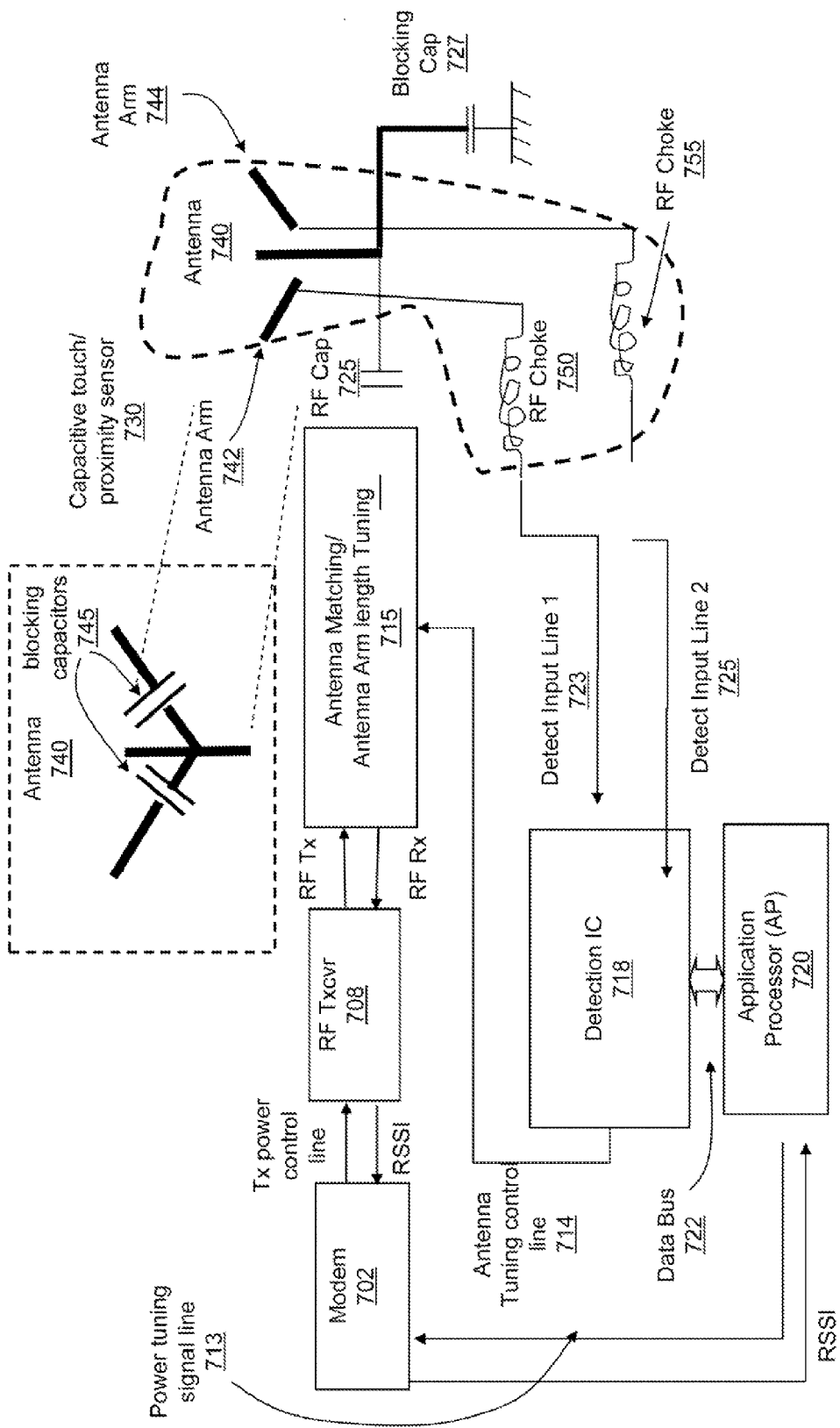
FIG. 7 illustrates a block diagram representation of RFCCs, including a CTPS, in a wireless communications device (WCD), according to a sixth embodiment.

FIG. 7 illustrates a block diagram representation of radio frequency communications components (RFCC), including a capacitive touch and proximity sensor, in a wireless communications device (WCD), according to a sixth embodiment. RFCC 700 illustrates a configuration that is similar to RFCC 200, with one distinction. Notably, this distinction can be applied to each of the other configurations of RFCC (FIGS. 3-6) for added functionality. RFCC 700 comprises AMTC 715 coupled to an output of RF transceiver 708. RFCC 700 also comprises antenna element 740 coupled to an output of AMTC 715 by coupling capacitor 725. Antenna element 740 is RF shorted to ground using a low frequency blocking capacitor 727. Antenna element 740 comprises multiple antenna arms (e.g., antenna arms 742 and 744) that can operate as sensor probes of CTPS 730. The multiple antenna arms are connected together by low frequency blocking capacitors 745. Antenna element 740 is further coupled by the multiple antenna arms to multiple RF chokes (e.g., RF chokes 750 and 755). Antenna element 740 having the multiple antenna arms, the multiple RF chokes (e.g., RF chokes 750 and 755), and the low frequency blocking capacitors (745) that connect the antenna arms collectively function to provide CTPS 730. CTPS 730 provides multiple sensor probes (e.g., antenna arms 742 and 744) that can be used for detecting physical contact by an object and presence of an object. Also included within RFCC 700 is detection IC 718 that is coupled to the multiple RF chokes (e.g., RF chokes 750 and 755) of CTPS 730 at multiple input ports of detection IC 718. RFCC 700 also includes modem 702 that is coupled to RF transceiver 708. RF transceiver 708 forwards/provides, to modem 702, a RSSI that provides information about RF signal power detected at antenna element 740. Additionally, RFCC 700 comprises AP 720 that is connected by data bus 722 to detection IC 718. In addition, according to the embodiment illustrated by RFCC 700, AP 720 is connected to an output signal port of modem 702 via power tuning signal line 713. This connection enables modem 702 to provide a transmit power adjustment at RF transceiver 708 based on a detected object's presence. However, in an alternate embodiment, RFCC 700 does not include power running signal line 713, and AP 720 is not connected to the output signal port of modem 702. With this alternate embodiment, modem 702 provides a transmit power adjustment at RF transceiver 708 independent of a detected object's presence. As also illustrated, AMTC 715 is coupled to detection IC 718.

In RFCC 700, the antenna element has multiple antenna arms 742, 744 that are connected together by low frequency blocking capacitors 745 that enable a change in capacitance of each of the multiple arms to be independently and separately detected through multiple input ports of detection IC 718. In RFCC 700, two antenna arms 742, 744 are specifically illustrated. These two antenna arms 742, 744 are connected by two RF chokes to detection IC 718. Detection IC 718 determines, using multiple object detection signals received at multiple input ports of detection IC 718, a change in capacitance in the multiple antenna arms 742, 744. As a result, the object presence is measured simultaneously by multiple probes (i.e., multiple antenna arms). In addition, detection IC 718 generates, and forwards (to AP 720), detection signal information that indicates characteristics of object detection associated with the specific antenna arms 742, 744 of AE 740. In addition to providing, to AP 720, information about electrical properties of a corresponding object detection signal, detection IC 718 provides, within the object detection information, additional information that maps each object detection signal to a corresponding antenna arm 742, 744 of the antenna element. AP 720 generates antenna tuning control signals by using the object detection signal information received from detection IC 718 corresponding to the multiple object detection signals received by the detection IC 718. In one embodiment, AP 720 uses (a) object detection information corresponding to the multiple object detection signals and (b) RF signal power information received from modem 702 to generate the antenna tuning control signals. After generating the antenna tuning control signals, AP 720 forwards the antenna tuning control signals to detection IC 718. Detection IC 718 propagates the antenna tuning control signals, via antenna tuning control line 714, to AMTC 715 in order to provide the corresponding antenna tuning Notably, in one embodiment, the tuning control signals that are generated can be a plurality of individual tuning signals targeting specific ones of the multiple antenna arms 742, 744. In this way, the antenna arm 742 or 744 that experiences the greatest de-tuning or signal power attenuation can receive greater tuning and power adjustment than a next antenna arm that is furthest away from the detected object and which may not experience a similar level of antenna de-tuning.

The use of multiple antenna arms can be applied to each of the previous configurations (i.e., RFCC 200 through RFCC 600). When object detection signal information associated with multiple independent object detection signals is received by the application processor, the application processor is able to use the object detection signal information associated with changes in capacitance at several antenna arms of the antenna element to determine whether a localized proximity of a detected object can be identified. In response to identifying the localized proximity of the detected object, AP 720 (a) determines a current operating condition of WCD 100 and (b) selects the appropriate antenna tuning to be performed by the AMTC by using a pre-established association between antenna tuning states and operating conditions.

FIG. 8 is a table that provides associations of object detection signal information with operating conditions and antenna tuning states, according to one embodiment. Table 800 comprises pre-established information that application processor 220 uses to provide a particular type and level of antenna tuning Table 800 provides five (5) columns of information corresponding to specific types of object detection that are identifiable by at least one object detection signal and/or corresponding object detection signal information which are provided in the different rows of table 800. In table 800, the first column provides information and parameters that identifies properties of the various types of detection signals that can be detected by detection IC 118. The second column defines the operating condition of the antenna relative to presence of particular types of objects. That column also provides information about the various operating conditions, corresponding to the detection signal data. For example, the column can identify (a) the particular type of object, e.g., body, hand, or other conductive object, that is within detectable range of the antenna element and/or antenna arms and (b) the position and/or proximity, size of the object, and/or which antenna arms simultaneously detect the object's presence. Collectively, the information about operating condition provided within the second column of table 800 can be used to indicate a severity of a de-tuning on the antenna element caused by a particular object's presence. The third column provides antenna tuning information for a particular antenna tuning state. The antenna tuning information can provide antenna tuning or re-tuning to compensate for the de-tuning impact to the antenna element that is caused by a particular object's presence, while the antenna element operates in a first operating frequency band. Based on prior field tests and measurements, object types and operating conditions can be identified based on the detection signal data. Furthermore, the de-tuning impact can be properly assessed and identified, and the appropriate or required antenna tuning compensation can be determined.

The fourth, fifth, and sixth columns provide antenna state tuning information for antenna tuning to compensate for the de-tuning impact to the antenna element by a detected object, while the antenna element operates in a second, third and other operating frequency bands, respectively. With the information available within table, the application processor (e.g., AP 220 . . . 720) can identify, from the pre-established object detection signal data, (a) a candidate object detection signal data that matches the received object detection signal information and (b) an operating condition that is associated with the identified candidate object detection signal data. When the identified candidate object detection signal data matches the received sensor signal information, the application processor determines that the operating condition that is associated with the identified candidate object detection signal data represents a current operating condition of WCD 100. The application processor determines an appropriate antenna tuning adjustment required to effectively compensate for an antenna de-tuning that is associated with the identified current operating condition. The appropriate antenna tuning adjustment is determined based on at least one of: (a) the current operating condition; (b) a current operating frequency band utilized by the wireless communications device; and (c) preset associations of operating conditions and antenna tuning states.

As illustrated by first row 802, object detection signal data1 is associated with operating condition1, a "free space" condition, in which, capacitive touch and proximity sensor 130 does not detect the presence of an object. When WCD 100 and/or antenna element 140 operates in a first operating frequency band, ODAT logic 110 identifies tuning "State 1" as the pre-established preferred antenna tuning state, while there is no object being detected by antenna element 140 of CTPS 130. However, if antenna element 140 operates in a second operating frequency band, ODAT logic 110 identifies tuning "State 2" as the pre-established optimal antenna tuning state, while there is no object is being detected by CTPS 130. Second row 804 shows that object detection signal data2 is associated with operating condition2 in which the application processor determines that CTPS 130 senses a first type of detectable object at a first proximity relative to the antenna element and/or at least one antenna arm. When antenna element 140 operates in a second operating frequency band, ODAT logic 110 identifies tuning "State 4" as the pre-established preferred antenna tuning state, while the first type of detectable object is within a first proximity of CTPS 130. Third row 806 similarly provides antenna tuning information associated with object detection signal data3. However, in third row 806, the application processor determines, using signal data3, that CTPS 130 senses a first type of detectable object at a second proximity relative to the antenna element and/or at least one antenna arm.

FIGS. 9-13 are flow charts illustrating the methods by which the above processes of the illustrative embodiments can be implemented. Although the method illustrated in FIGS. 9-13 may be described with reference to components and functionality illustrated by and described in reference to FIGS. 1-8, it should be understood that this is merely for convenience and alternative components and/or configurations thereof can be employed when implementing the various methods. Certain portions of the methods may be completed by ODAT utility 110 executing on AP 120 or DSP 186 within WCD 100 (FIG. 1) or executing on the respective applications processor 220 . . . 720 of RFCCs of FIGS. 2-7. The executed processes then control specific operations of or on WCD 100 and/or the particular RFCC. For simplicity is describing the various methods, all method processes are described from the perspective of AP 120 or the specific AP associated with the configuration of RFCC (FIGS. 2-7) within which the particular method is implemented For example, a method that is applicable to RFCC 300 can be described as being performed by AP 320. A method that can be provided by any one of the configurations or multiple of the configurations will be described as being performed by AP 120. In such situations, AP 120 can provide the required functionality of any AP illustrated within one or more specific configurations of RFCC (FIGS. 2-7) associated with the particular method.

Figure 9:
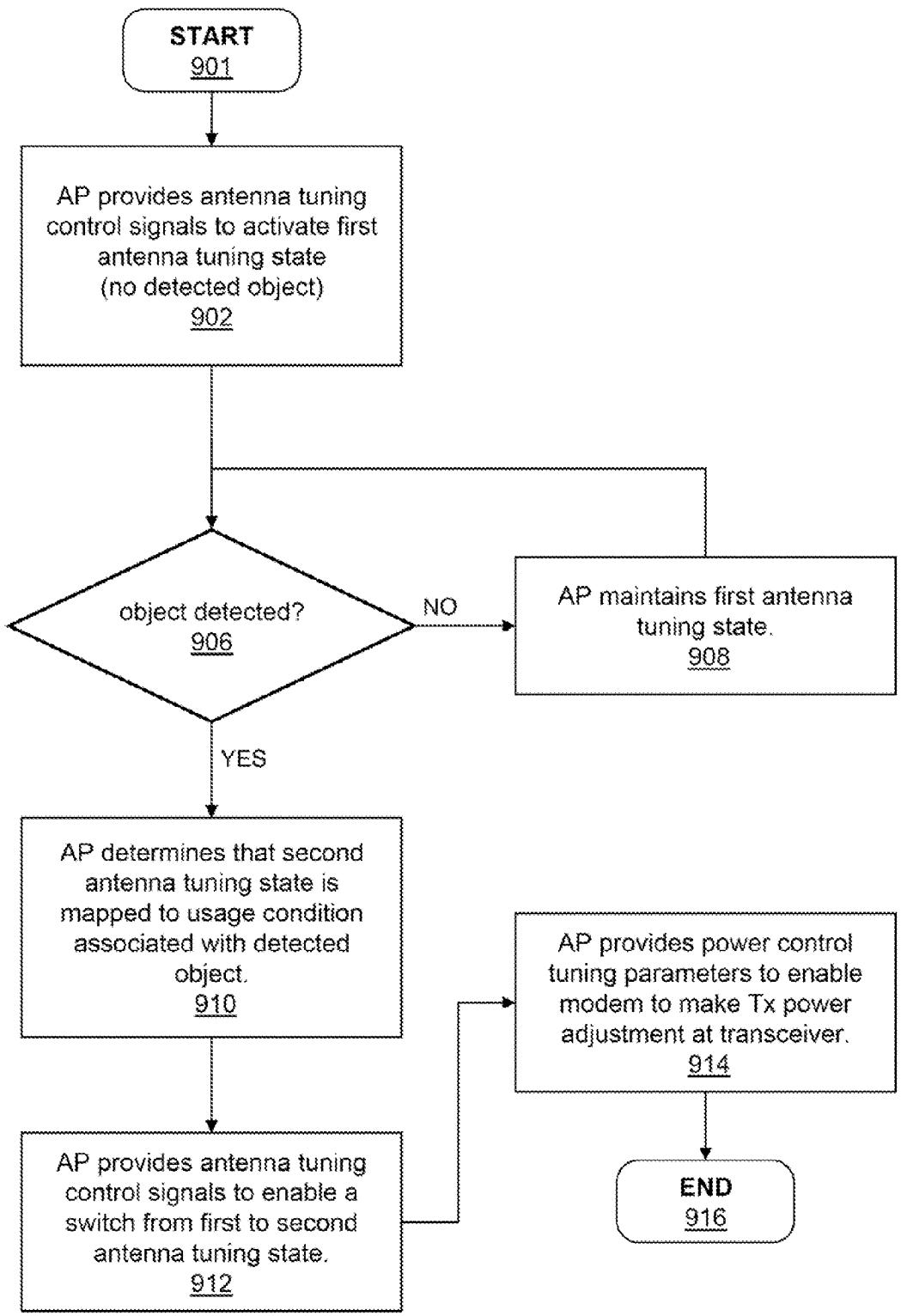
FIG. 9 is a flow chart illustrating the method for selecting antenna tuning states and adjusting radio frequency (RF) transmit power, in response to detection of an object by a detection IC coupled to a CTPS, according to one embodiment.

FIG. 9 illustrates the method for selecting antenna tuning states and adjusting radio frequency (RF) transmit power, in response to an object being detected by a detection IC using a CTPS, according to the RFCC configuration illustrated by FIGS. 3-5. The method begins at initiator block 901 and proceeds to block 902 at which, AP 120 triggers a first default antenna tuning state corresponding to the antenna operating in free space (i.e., with no object detected by AMTS). At decision block 906, AP 120 determines from detection signal information received from detection IC 318 whether an object is currently being detected. If at decision block 906, AP 320 determines that an object is not currently being detected, AP 120 maintains the first antenna tuning state, as shown at block 908. However, if at decision block 906 AP 120 determines that an object is currently being detected, the process moves to block 910, at which AP 120 identifies a second antenna tuning state that is associated within the table 800 with the particular object detection signal information received from detection IC 318/418. AP 120 also identifies a pre-established usage condition associated with characteristics such as object type, object proximity, and object size of the object detection. In the embodiments illustrated by FIGS. 3-5, AP 320/420/520 uses RF signal power information received from the modem and the object detection signal power information to determine the appropriate antenna tuning state required. At block 912, AP 120 provides antenna tuning control signals to enable a switch from the first to the second antenna tuning state. At block 914, AP 120 provides power control tuning parameters to enable modem 302 to apply a transmit power adjustment at RF transceiver 308. The process ends at block 916.

Figure 10:
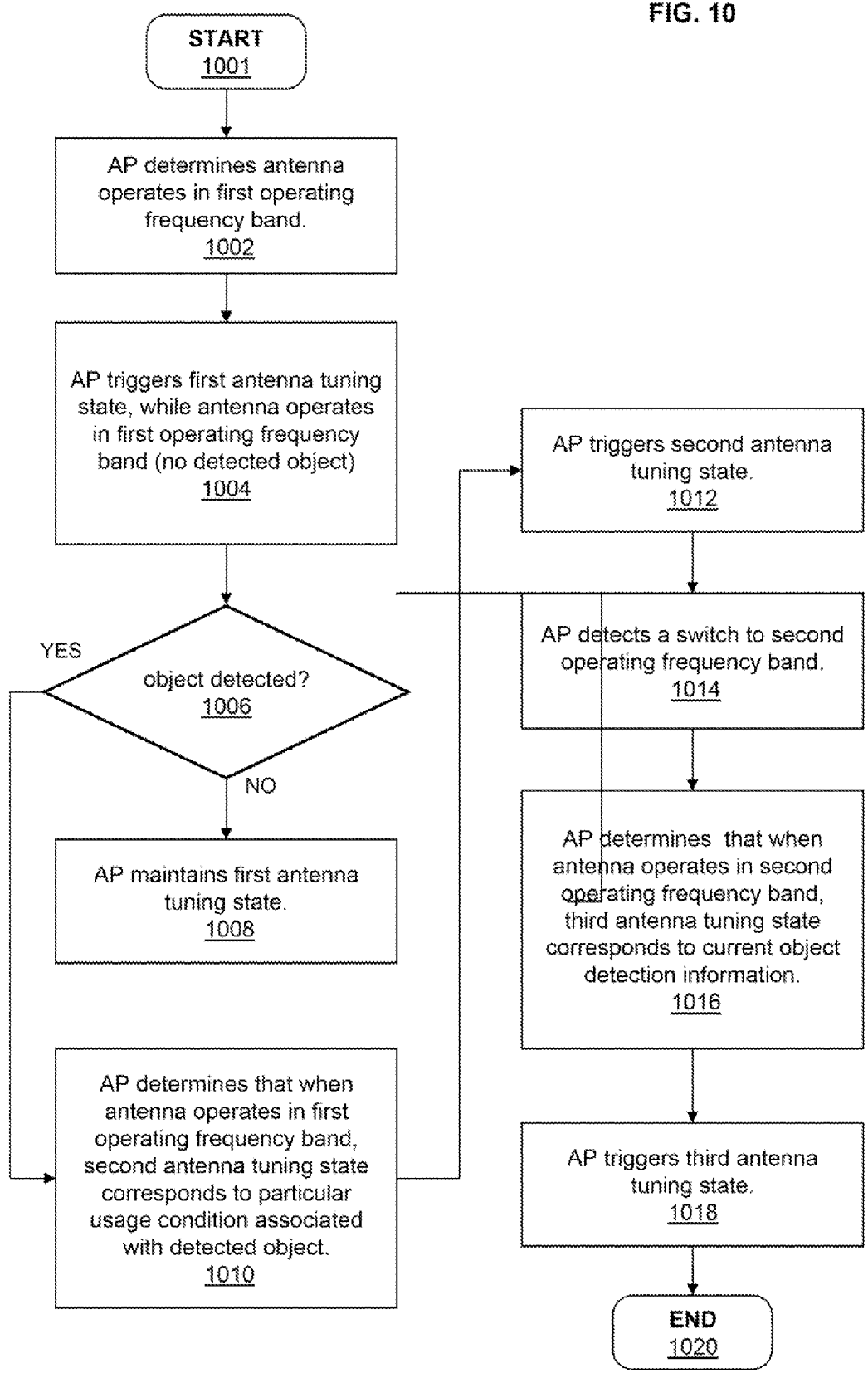
FIG. 10 is a flow chart illustrating the method for selecting antenna tuning states based on an operating frequency band and adjusting RF transmit power, in response to detection of an object by a detection IC coupled to a CTPS, according to one embodiment.

FIG. 10 illustrates the method for selecting, based on an operating frequency band, antenna tuning states and adjusting radio frequency (RF) transmit power, in response to an object being detected by a detection IC using a CTPS. Aspects of the method are applicable to the configuration of FIG. 2. The method begins at initiator block 1001 and proceeds to block 1002 at which, AP 220 determines that antenna element 240 operates in a first operating frequency band. At block 1004, AP 220 triggers a first antenna tuning state while antenna element 240 operates in the first operating frequency band. At decision block 1006, AP 220 determines from object detection signal information received from detection IC 218 whether an object is detected. If at decision block 1006, AP 220 determines that no object is currently detected, AP 220 maintains the first antenna tuning state, as shown at block 1008. Following block 1008, the process returns to decision block 1006. However, if at decision block 1006 AP 220 determines that an object is currently being detected, the process moves to block 1010, at which, AP 220 determines that a second antenna tuning state corresponds to a current object detection signal information, while an antenna element is operating in the first operating frequency band. At block 1012, AP 220 provides control signals to switch antenna tuning states from the first to the second antenna tuning state. At block 1014, AP 220 detects a switch by the device (e.g., WCD 100) from the first operating frequency band to a second operating frequency band. At block 1016, AP 220 determines that a third antenna tuning state corresponds to the current detection signal information, while the antenna element is operating in the second operating frequency band. AP 220 provides control signals to trigger the third antenna tuning state, as shown at block 1018. The process ends at block 1020.

Figure 11:
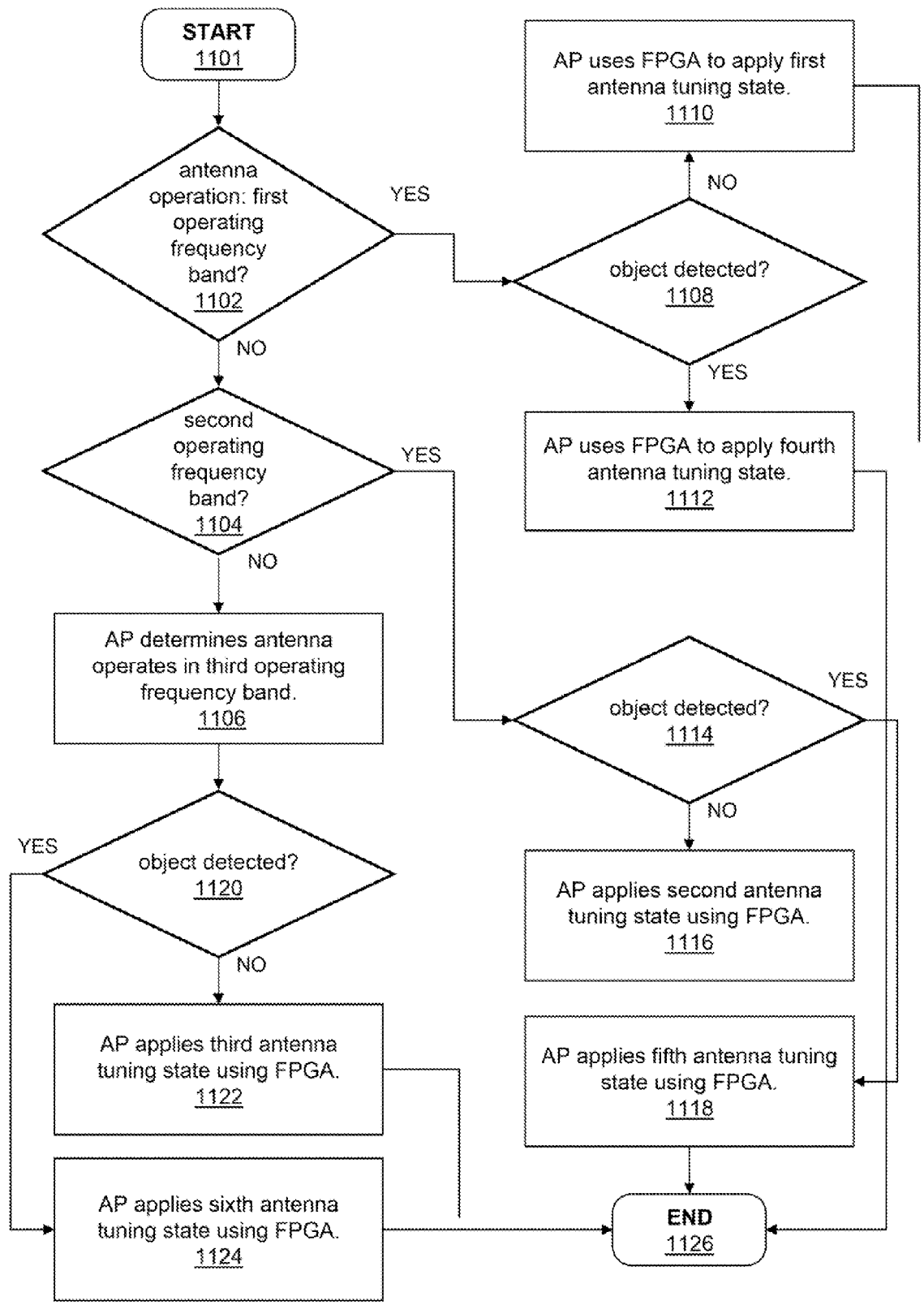
FIG. 11 is a flow chart illustrating the method for selecting antenna tuning states based on an operating frequency band and utilizing a Field Programmable Gate Array (FPGA) to provide antenna tuning state adjustments, according to one embodiment.

FIG. 11 illustrates the method for selecting antenna tuning states and adjusting radio frequency (RF) transmit power, in response to an object detection using a CTPS. The selection and adjustments made by the method of FIG. 11 are based on an operating frequency band. Additionally, FIG. 11 illustrates the method for utilizing an FPGA to apply antenna tuning state adjustments at AMTC 615, within the configuration provided by FIG. 6. The method begins at initiation block 1101 and proceeds to decision block 1102 at which, AP 608 determines whether antenna element is operating in a first operating frequency band. If at decision block 1102, AP 620 determines that the antenna element is operating within a first operating frequency band, the method moves to decision block 1108. At decision block 1108, AP 620 determines, from analyzing the object detection signal information received from by detection IC 618, whether an object is being detected by CTPS 630. If at decision block 1108, AP 620 determines that no object is currently being detected, AP 620 sends antenna tuning control signals to FPGA 670 to cause FPGA 670 to apply a first antenna tuning state at AMTC 615, as shown at block 1110. However, if at decision block 1108 AP 620 determines that an object is currently detected, AP 620 sends antenna tuning control signals to FPGA 670 to cause FPGA 670 to apply a fourth antenna tuning state at AMTC 615, as shown at block 1112.

Returning to block 1102, if at decision block 1102, AP 620 determines that the antenna element is not operating within the first operating frequency band, AP 620 determines whether the antenna element is operating in a second operating frequency band, as shown at decision block 1104. If at decision block 1104, AP 620 determines that antenna element 640 is operating in the second operating frequency band, the process moves to decision block 1114 at which AP 620 determines whether an object is currently detected by detection IC 618. If at decision block 1114, AP 620 determines that an object is not currently detected, AP 620 sends antenna tuning control signals to FPGA 670 to cause FPGA 670 to apply a second antenna tuning state at AMTC 615, as shown at block 1116. However, if at decision block 1114 AP 620 determines that an object is currently detected, AP 620 sends antenna tuning control signals to FPGA 670 to cause FPGA 670 to apply a fifth antenna tuning state at AMTC 615, as shown at block 1118.

Referring again to decision block 1104, if at decision block 1104 AP 620 determines that antenna element 640 is not operating in the second operating frequency band, the process moves to block 1106. In one embodiment, WCD 100 is able to configure a first, a second and a third operating frequency band. In a related embodiment, the third frequency band represents a collection of configurable operating frequency bands besides the first and the second operating frequency bands. Referring to an implementation in which the third operating frequency represents the third of three configurable operating frequency bands or the collection of configurable operating frequency bands besides the first and the second operating frequency bands, AP 620 can determine, by a process of elimination, that antenna element 640 operates in the third operating frequency band, as shown at block 1106. It is understood that WCD 100 may be able to configure more than three operating frequency bands and the use of three operating frequency bands in this description is used solely for illustration. At decision block 1120, AP 620 determines whether an object is currently detected by detection IC 618. If at decision block 1120, AP 620 determines that an object is not currently detected, AP 620 sends antenna tuning control signals to FPGA 670 to cause FPGA 670 to apply a third antenna tuning state at AMTC 615, as shown at block 1122. However, if at decision block 1120 AP 620 determines that an object is currently detected, AP 620 sends antenna tuning control signals to FPGA 670 to cause FPGA 670 to apply a sixth antenna tuning state at AMTC 615, as shown at block 1124. The process ends at block 1126.

Figure 12:
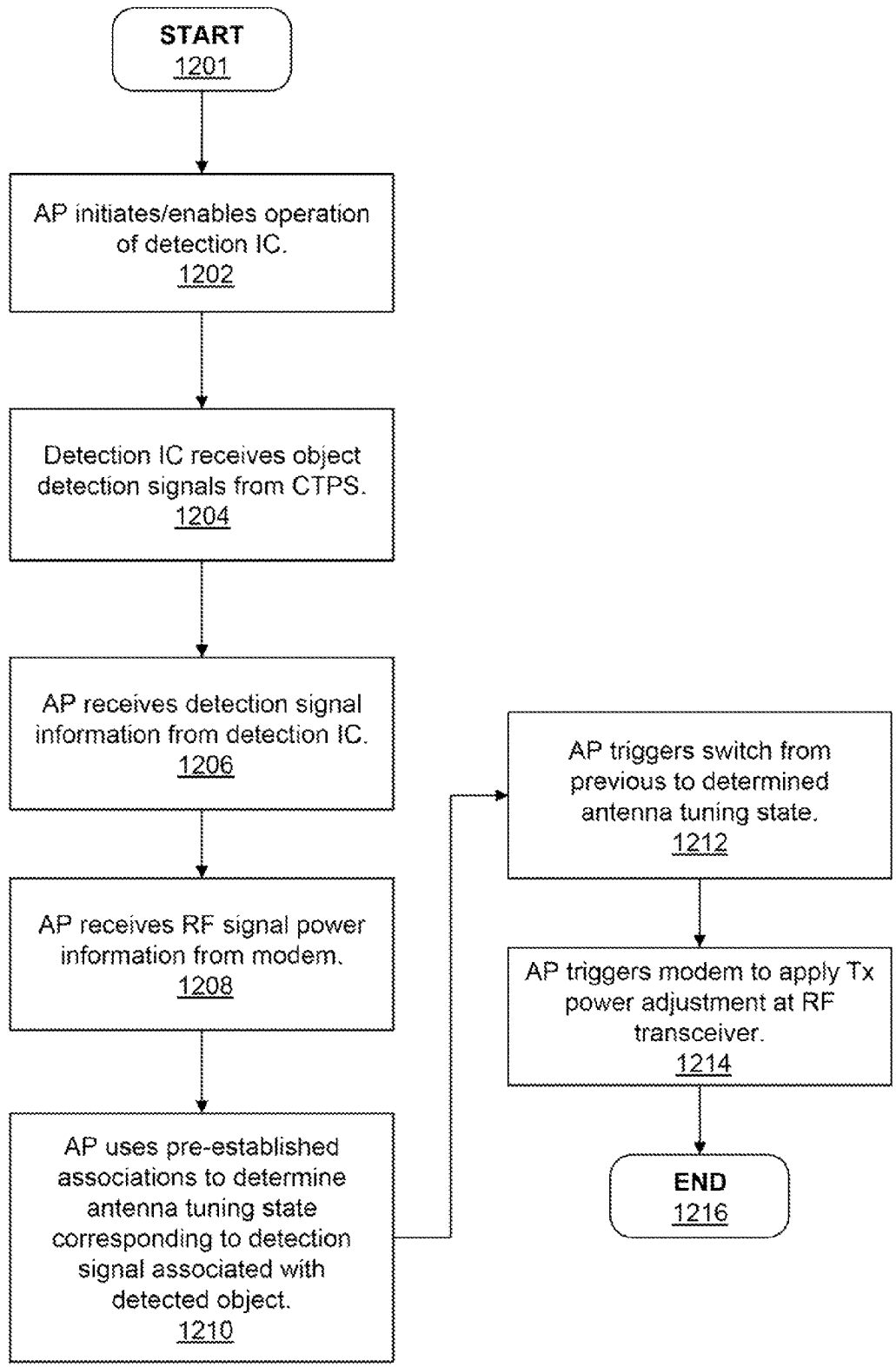
FIG. 12 is another flow chart illustrating the method for selecting antenna tuning states and adjusting RF transmit power, in response to detection of an object by a detection IC coupled to a CTPS, according to one embodiment.

FIG. 12 illustrates the method for selecting antenna tuning states and adjusting radio frequency (RF) transmit power, in response to an object being detected by a detection IC using a CTPS, according to the embodiment illustrated by FIG. 3. The method begins at initiator block 1201 and proceeds to block 1202 at which, AP 320 initiates and/or enables operation of detection IC 318. At block 1204, detection IC 318 receives at least one object detection signal using CTPS 330. AP 320 receives detection signal information from detection IC 318, as shown at block 1206. At block 1208, AP 320 receives RF signal power information from modem 302. AP 320 uses pre-established associations, such as associations provided by table 800, to determine an antenna tuning state corresponding to the object detection signal, as shown at block 1210. At block 1212, AP 320 provides antenna tuning control signals to switch to and/or apply the determined antenna tuning state. In addition, AP 320 sends power control parameters to modem 302 to cause modem 302 to apply a transmit power adjustment at RF transceiver 308, as shown at block 1214. The process ends at block 1216.

Figure 13:
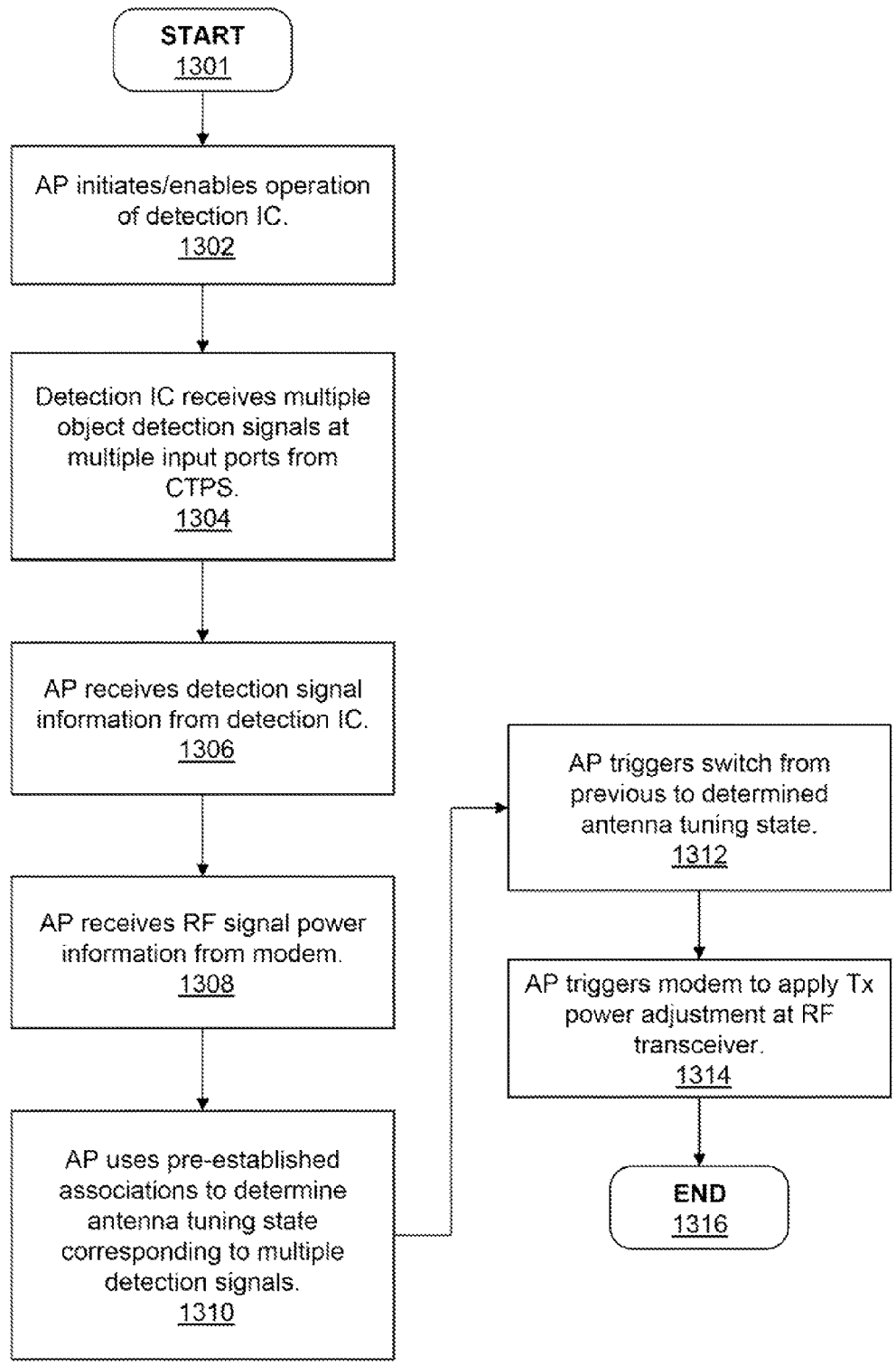
FIG. 13 is a flow chart illustrating the method for selecting antenna tuning states and adjusting RF transmit power, in response to detection of an object by a detection IC coupled to a CTPS that includes multiple antenna arms, according to one embodiment.

FIG. 13 illustrates the method for selecting antenna tuning states and adjusting radio frequency (RF) transmit power, in response to an object being detected by a detection IC using a CTPS that utilizes multiple antenna arms as sensor probes, according to the configuration illustrated by FIG. 7. The method begins at initiator block 1301 and proceeds to block 1302 at which, AP 720 enables or initiates operation of detection IC 718. At block 1304, detection IC 718 receives multiple object detection signals at multiple input ports of detection IC 718 from CTPS 730. AP 720 receives detection signal information corresponding to the multiple object detection signals from detection IC 718, as shown at block 1306. At block 1308, AP 720 receives RF signal power information from modem 702. AP 220 uses pre-established associations, such as associations provided in table 800, to determine an antenna tuning state corresponding to the multiple detection signals, as shown at block 1310. At block 1312, AP 720 provides antenna tuning control signals to apply the determined current antenna tuning state corresponding to the objection detection. In addition, AP 720 sends power control parameters to modem 702 to cause modem 702 to apply a transmit power adjustment at RF transceiver 708, as shown at block 1314. The process ends at block 1316.

The flowcharts and block diagrams in the various figures presented and described herein illustrate the architecture, functionality, and operation of possible implementations of systems, methods and computer program products according to various embodiments of the present disclosure. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Thus, while the method processes are described and illustrated in a particular sequence, use of a specific sequence of processes is not meant to imply any limitations on the disclosure. Changes may be made with regards to the sequence of processes without departing from the spirit or scope of the present disclosure. Use of a particular sequence is therefore, not to be taken in a limiting sense, and the scope of the present disclosure extends to the appended claims and equivalents thereof.

In some implementations, certain processes of the methods are combined, performed simultaneously or in a different order, or perhaps omitted, without deviating from the spirit and scope of the disclosure. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular system, device or component thereof to the teachings of the disclosure without departing from the essential scope thereof. Therefore, it is intended that the disclosure not be limited to the particular embodiments disclosed for carrying out this disclosure, but that the disclosure will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A wireless communications device comprising:
    a radio frequency (RF) transceiver;
    an antenna matching and tuning circuit (AMTC) coupled to an output of the RF transceiver;
    an antenna element (AE) coupled to an output of the AMTC by a first coupling capacitor and RF connected by a second low frequency blocking capacitor to ground to prevent a flow of low frequency signals to ground, wherein the AE is a first component of a capacitive touch and proximity sensor (CTPS) which includes a high impedance component (HIC) directly coupled to the AE;
    a detection integrated circuit (IC) connected to the HIC of the CTPS and which: detects a change in capacitance of the CTPS caused proximity of an object to the antenna element, while the antenna element is being used to communicate RF signals; and responsive to detection of the change in capacitance of the CTPS, triggers a transmission of at least one control signal to the AMTC to provide an appropriate antenna tuning to offset antenna de-tuning caused by the proximity of the object to the antenna element;
    a modem coupled to the RF transceiver; and
    an application processor (AP) that is coupled to the detection IC and the modem, wherein the application processor: (a) selectively enables operation of the detection IC based on information received from the modem about RF signal power at the AE; (b) receives object detection signal information from the detection IC; and (c) generates, using the information about RF signal power and the object detection signal information, (i) antenna tuning control signals and (ii) power tuning parameters to trigger a transmit power adjustment.

2. The wireless communications device of claim 1, wherein:
    the ATMC is coupled to the detection IC, and the detection IC: responsive to receiving, (a) an activation signal from the application processor to enable operation of said detection IC and (b) at least one object detection signal from the CTPS, forwards object detection signal information to the application processor;
    the application processor, in response to receiving the object detection signal information: generates antenna tuning control signals that provide at least one of (a) a level of compensatory antenna impedance tuning and (b) an amount of compensatory antenna length adjustment in the antenna tuning and matching circuit; forwards the antenna tuning control signals to the detection IC to cause the detection IC to send the antenna tuning control signals to the AMTC to provide the corresponding antenna tuning; and forwards the power tuning parameters to the modem;
    the modem generates transmit power control signals to adjust the transmit power of the RF transceiver responsive to the tuning parameters being received from the AP.

3. The wireless communications device of claim 1, wherein the modem is coupled to an output port of the detection IC and generates transmit power control signals to adjust the transmit power of the RF transceiver based on object detection signal information received directly from the output port of the detection IC.

4. The wireless communications device of claim 1, wherein the modem is coupled to an output port of the detection IC, and the modem:
    generates (a) transmit power control signals to adjust the transmit power of the RF transceiver, and (b) an antenna tuning control signal; and propagates the antenna tuning control signal to the AMTC to provide the appropriate antenna tuning.

5. The wireless communications device of claim 1, wherein:
    the application processor: (a) generates, using the received RF signal power information and the object detection signal information, a tuning control signal and a power control signal; (b) forwards the tuning control signal to the AMTC to trigger a corresponding antenna tuning;

and (c) forwards the power control signal to the modem to trigger a transmit signal power adjustment at the RF transceiver.

6. The wireless communications device of claim 1, further comprising:
a Field Programmable Gate Array (FPGA) component coupled to at least one output of the application processor and to a control signal input of the AMTC;
wherein the application processor: generates a transmit power control signal and multiple tuning control signals; forwards the transmit power control signal to the modem to trigger a transmit signal power adjustment at the RF transceiver; and forwards the multiple tuning control signals to the FPGA component to cause the FPGA component to selectively provide the AMTC with at least one of (a) a first control signal for antenna tuning in response to switching an operating frequency band of the AE and (b) a second control signal for antenna tuning based on an at least one object detection signal.

7. The wireless communications device of claim 1, wherein:
the antenna element has multiple antenna arms that are connected together by coupling capacitors which enables a change in capacitance of each of the multiple arms to be independently and separately detected through multiple input ports of the detection IC;
the at least one HIC comprises multiple RF chokes that are coupled to each antenna arm and to each of a plurality of input ports of the detection IC;
the antenna element, the coupling capacitors that connect the multiple antenna arms, and the multiple RF chokes constitute the CTPS;
the detection IC: determines, using multiple object detection signals received from the CTPS at multiple input ports of the detection IC, a change in capacitance in each of the multiple antenna arms caused by a presence of at least one object, and generates object detection signal information associated with object detection corresponding to at least one individual antenna arm of the AE; and
the application processor generates said tuning parameters by using a collective object detection signal information received from the detection IC corresponding to the multiple object detection signals received by the detection IC.

8. The wireless communications device of claim 7, wherein the application processor:
in response to receipt of the object detection signal information associated with multiple, independent object detection signals, the application processor uses the object detection signal information associated with object detection by several antenna arms of the antenna element to determine whether a localized proximity of a detected object can be identified; and
in response to identifying the localized proximity of the detected object, (a) determines a current operating condition of the wireless communications device and (b) selects the appropriate antenna tuning to be performed by the antenna matching and tuning circuit by using a pre-established association between operating conditions and antenna tuning.

9. The wireless communications device of claim 1, wherein the application processor:
in response to receiving the object detection signal information, retrieves a stored data structure that comprises associations of operating condition with pre-established object detection signal data corresponding to a type and proximity of object detection by the CTPS;
identifies, from the pre-established object detection signal data, a first object detection signal data that matches the received object detection signal information;
identifies an operating condition that is associated with the first object detection signal data, wherein the identified operating condition indicates a current operating condition of the wireless communications device with a detected object;
determines an appropriate antenna tuning adjustment required to effectively compensate for an antenna de-tuning that is associated with the identified current operating condition;
wherein the appropriate antenna tuning adjustment is determined based on at least one of: (a) the current operating condition; (b) a current operating frequency band utilized by the wireless communications device; and (c) preset associations of operating conditions and antenna tuning states; and
automatically generates control signals to effect the determined appropriate antenna tuning adjustment required.

10. In a wireless communications device having an antenna element capacitively coupled to an antenna matching and tuning circuit (AMTC) and coupled to at least one radio frequency (RF) choke to provide a capacitive touch and proximity sensor (CTPS), wherein said wireless communications device includes an application processor coupled to a detection IC, and wherein the detection IC is coupled to the AMTC, said wireless communications device includes an RF transceiver that is coupled to the AMTC and a modem that is coupled to the RF transceiver and to the application processor, a method comprising:
detecting via the CTPS a presence of an object within a specific proximity to the antenna element, wherein said detecting is caused by a change in a capacitance of the CTPS indicated by at least one object detection signal that is received by the detection IC;
receiving, at the application processor, object detection signal information from the detection IC, wherein the object detection signal information includes a signal amplitude for a corresponding object detection signal;
determining, at the application processor, an antenna tuning state including a type and amount of antenna tuning that corresponds to the received object detection signal information;
receiving RF signal power information at the application processor from the modem;
generating the at least one control signal to provide antenna tuning corresponding to the object detection signal information and the RF signal power information received to compensate for the presence of the object; and
responsive to generating the at least one control signal, forwarding, by the application processor, the control signal to the detection IC to cause the detection IC to propagate the at least one control signal to the AMTC to trigger antenna tuning that can compensate for antenna de-tuning caused by the proximity of the object to the capacitive touch and proximity sensor.

11. The method of claim 10, wherein said detection IC is coupled to said modem, and the method further comprises:
generating, at the application processor, power control information to indicate a signal power adjustment that is appropriate at the RF transceiver, corresponding to the RF signal power information and the object detection signal information;

forwarding the power control information to the modem to trigger the modem to generate a power control signal and to propagate the power control signal to the RF transceiver in order to provide a corresponding signal power adjustment.

12. In a wireless communications device having an antenna element capacitively coupled to an antenna matching and tuning circuit (AMTC) and coupled to at least one radio frequency (RF) choke to provide a capacitive touch and proximity sensor (CTPS), wherein said wireless communications device includes an application processor coupled to a detection IC, an RF transceiver that is coupled to the AMTC, and a modem that is coupled to each of the RF transceiver, the detection IC, the AMTC, and the application processor, a method comprising:

detecting via the CTPS a presence of an object within a specific proximity to the antenna element, wherein said detecting is caused by a change in a capacitance of the CTPS indicated by at least one object detection signal that is received by the detection IC;

determining an antenna tuning state corresponding to the at least one object detection signal;

receiving RF signal power information at the application processor from the modem;

generating, at the application processor, (a) power control information and (b) at least one antenna tuning control signal, utilizing the RF signal power information and the object detection signal information; and forwarding the generated power control information and the at least one antenna tuning control signal to the modem, wherein the generated power control information triggers the modem to (a) generate a first control signal to trigger a corresponding signal power adjustment at the RF transceiver, and (b) propagate the at least one antenna tuning control signal to the AMTC to compensate for antenna de-tuning caused by the proximity of the object to the capacitive touch and proximity sensor.

13. In a wireless communications device having an antenna element capacitively coupled to an antenna matching and tuning circuit (AMTC) and coupled to at least one radio frequency (RF) choke to constitute a capacitive touch and proximity sensor (CTPS), wherein said wireless communications device includes (a) an application processor coupled to a detection IC and to a control input of the AMTC, (b) an RF transceiver that is coupled to the AMTC, and (c) a modem that is coupled to the RF transceiver and to the application processor, a method comprising:

detecting via the CTPS a presence of an object within a specific proximity to the antenna element, wherein said detecting is caused by a change in a capacitance of the CTPS indicated by at least one object detection signal that is received by the detection IC;

determining an antenna tuning state corresponding to the at least one object detection signal;

generating, at the application processor, at least one tuning control signal and a power control signal to compensate for the presence of the object;

propagating the at least one tuning control signal to the AMTC to trigger antenna tuning that can compensate for antenna de-tuning caused by the proximity of the object to the capacitive touch and proximity sensor; and propagating the power control signal to the modem to trigger an appropriate level of signal power adjustment at the RF transceiver.

14. The method of claim 13, wherein:

said wireless communications device includes a Field Programmable Gate Array (FPGA) component that is coupled between at least two outputs of the application processor and the control input of said antenna matching and tuning circuit;

the at least one tuning control signal comprises multiple tuning control signals including (a) a first control signal for antenna tuning in response to the device switching an operating frequency band and (b) a second control signal for antenna tuning in response to an object being detected via the CTPS; and the method further comprises:

propagating the first control signal and the second control signal to the FPGA component; and selectively providing, via the FPGA component, the AMTC with at least one of (a) the first control signal and (b) the second control signal.

15. In a wireless communications device having an antenna element capacitively coupled to an antenna matching and tuning circuit (AMTC) and coupled to at least one radio frequency (RF) choke, a capacitive touch and proximity sensor (CTPS) including the at least one RF choke and the antenna element, a method comprising:

detecting via the CIPS a presence of an object within a specific proximity to the antenna element, wherein said detecting is caused by a change in a capacitance of the CTPS indicated by at least one object detection signal that is received by a detection IC;

determining an antenna tuning state corresponding to the at leapt one object detection signal;

generating at least one control signal to provide antenna tuning to compensate for the presence of the object; and propagating the at least one control signal to the AMTC to trigger antenna tuning that can compensate for antenna de-tuning caused by the proximity of the object to the capacitive touch and proximity sensor;

wherein the first antenna element has multiple antenna arms that are connected together by coupling capacitors, wherein the at least one RF choke comprises multiple RF, a respective choke coupled to each antenna arm and to each of a plurality of input ports of the detection IC, wherein the detection IC determines, using multiple object detection signals received at multiple input ports of the detection IC, a change in capacitance in each of the multiple antenna arms, wherein the application processor generates tuning parameters using the collective object detection signal information that is received from the detection IC and which collective object detection signal information corresponds to the multiple object detection signals received by the detection IC.

16. In a wireless communications device having an antenna element capacitively coupled to an antenna matching and tuning circuit (AMTC) and coupled to at least one radio frequency (RF) choke, and a capacitive touch and proximity sensor (CTPS) including the antenna element and die at least one RF choke, a method comprising:

detecting via the CTPS a presence of an object within a specific proximity to the antenna element, wherein said detecting is caused by a changing in a capacitance of the CTPS indicated by at least one object detection signal that is received by a detection IC;

determining an antenna tuning state corresponding to the at least one object detection signal;

in response to receiving the object detection signal information, retrieving a stored data structure that comprises associations of operating condition with pre-established object detection signal data corresponding to a type and proximity of object detection by the CTPS;

identifying, from the pre-established object detection signal data, a first object detection signal data that matches the received object detection signal information;

identifying an operating condition that is associated with the first object detection signal data, wherein the identified operating condition indicates a current operating condition of the wireless communications device and antenna element relative to a presence of an object;

determining an appropriate antenna tuning adjustment required to effectively compensate for an antenna de-tuning that is associated with the identified current operating condition;

wherein the appropriate antenna tuning adjustment is determined based on at least one of: (a) the current operating condition; (b) a current operating frequency band utilized by the wireless communications device; and (c) preset associations of operating conditions and antenna tuning states;

automatically generating the at least one control signal to effect the determined appropriate antenna tuning adjustment required; and propagating the at least one control signal to the AMTC to trigger antenna tuning that can compensate for antenna de-tuning caused by the proximity of the object to the capacitive touch and proximity sensor.

* * * * *

UNITED STATES PATENT AND TRADEMARK OFFICE
CERTIFICATE OF CORRECTION

PATENT NO. : 8,971,826 B2  Page 1 of 1
APPLICATION NO. : 13/401933
DATED : March 3, 2015
INVENTOR(S) : Abdul Gaffoor et al.

It is certified that error appears in the above-identified patent and that said Letters Patent is hereby corrected as shown below:

In the Claims

Claim 15, Column 22, line 25, please replace "via the CIPS" with -- via the CTPS --.

Claim 15, Column 22, line 31, please replace "leapt one object" with -- least one object --.

Claim 16, Column 22, line 56, please replace "and die at least" with -- and the at least --.

Claim 16, Column 22, line 60, please replace "by a changing in a" with -- by a change in a --.

Signed and Sealed this
Sixteenth Day of June, 2015

Michelle K. Lee
*Director of the United States Patent and Trademark Office*